(12) United States Patent
Rim et al.

(10) Patent No.: US 11,514,973 B2
(45) Date of Patent: Nov. 29, 2022

(54) MEMORY ARRAY WITH MULTIPLE POWER SUPPLY NODES AND SWITCH CONTROLLERS FOR CONTROLLING POWER SUPPLY NODES FOR RELIABLE WRITE OPERATION AND METHOD OF OPERATION

(71) Applicant: SAMSUNG ELECTRONICS CO., LTD., Suwon-si (KR)

(72) Inventors: Woojin Rim, Hwaseong-si (KR); Yongho Kim, Seoul (KR); Hoonki Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/003,038

(22) Filed: Aug. 26, 2020

(65) Prior Publication Data
US 2021/0264965 A1    Aug. 26, 2021

(30) Foreign Application Priority Data

Feb. 26, 2020  (KR) .................. 10-2020-0023445

(51) Int. Cl.
| | | |
|---|---|---|
| *G11C 11/408* | (2006.01) | |
| *G11C 11/4074* | (2006.01) | |
| *G11C 11/4097* | (2006.01) | |
| *G11C 11/4094* | (2006.01) | |
| *G11C 5/14* | (2006.01) | |

(Continued)

(52) U.S. Cl.
CPC ............ *G11C 11/4085* (2013.01); *G11C 5/14* (2013.01); *G11C 7/12* (2013.01); *G11C 11/4074* (2013.01); *G11C 11/4087* (2013.01); *G11C 11/4094* (2013.01); *G11C 11/4097* (2013.01); *G11C 11/413* (2013.01); *G11C 11/416* (2013.01); *G11C 11/417* (2013.01); *G11C 11/418* (2013.01); *G11C 11/419* (2013.01)

(58) Field of Classification Search
CPC ... G11C 11/416; G11C 11/419; G11C 11/417; G11C 11/413; G11C 11/418; G11C 5/14; G11C 7/12
See application file for complete search history.

(56) References Cited

U.S. PATENT DOCUMENTS

| | | | |
|---|---|---|---|
| 8,630,132 B2 | 1/2014 | Cheng et al. | |
| 9,001,572 B2 * | 4/2015 | Choi ................... | G11C 5/14 365/185.23 |

(Continued)

FOREIGN PATENT DOCUMENTS

KR           101986415 B1      6/2019

*Primary Examiner* — Mushfique Siddique
(74) *Attorney, Agent, or Firm* — Sughrue Mion, PLLC

(57) ABSTRACT

A memory device is provided. The memory device includes a cell array having memory cells; n word lines sequentially arranged and including a first word line, an n-th word line, and word lines interposed between the first word line and the n-th word line; bit lines; a first power node located adjacent to the first word line; a second power node located adjacent to the n-th word line; a first switch connected between the first power node and the cell array; a write driver located adjacent to the n-th word line and connected to the bit lines; and a switch controller configured to control the first switch to isolate the first power node from the memory cells during a write operation on memory cells connected to the first word line.

19 Claims, 16 Drawing Sheets

(51) Int. Cl.
*G11C 11/419* (2006.01)
*G11C 11/418* (2006.01)
*G11C 11/413* (2006.01)
*G11C 7/12* (2006.01)
*G11C 11/417* (2006.01)
*G11C 11/416* (2006.01)

(56) References Cited

U.S. PATENT DOCUMENTS

| | | |
|---|---|---|
| 9,117,510 B2 | 8/2015 | Yang et al. |
| 9,208,860 B2 | 12/2015 | Ngo et al. |
| 9,721,650 B1 | 8/2017 | Raj et al. |
| 9,741,429 B1 | 8/2017 | Chen et al. |
| 10,522,216 B2 | 12/2019 | Jung et al. |
| 2006/0262628 A1* | 11/2006 | Nii .................. G11C 11/412 365/226 |
| 2009/0207650 A1* | 8/2009 | Braceras ............ G11C 11/417 365/156 |
| 2015/0131364 A1 | 5/2015 | Hsieh et al. |
| 2016/0042785 A1* | 2/2016 | Rim .................. G11C 11/412 365/156 |
| 2019/0066773 A1* | 2/2019 | Park .................. G11C 11/419 |
| 2019/0080736 A1* | 3/2019 | Baeck ................ G11C 11/418 |
| 2019/0164596 A1* | 5/2019 | Lee .................... G11C 29/021 |

\* cited by examiner

MEMORY ARRAY WITH MULTIPLE POWER SUPPLY NODES AND SWITCH CONTROLLERS FOR CONTROLLING POWER SUPPLY NODES FOR RELIABLE WRITE OPERATION AND METHOD OF OPERATION

CROSS-REFERENCE TO RELATED APPLICATION

This application claims priority from Korean Patent Application No. 10-2020-0023445, filed on Feb. 26, 2020 in the Korean Intellectual Property Office, the disclosure of which is incorporated herein by reference in its entirety.

BACKGROUND

Methods and apparatuses consistent with example embodiments relate to a memory device, and more particularly, to a memory device for a reliable write operation and an operating method of the memory device.

Due to the demand for highly integrated semiconductor devices and the development of semiconductor processes, widths, pitches, and/or heights of interconnections included in an integrated circuit (IC) may be reduced, and parasitic elements of the interconnections may be increased. Also, to reduce power consumption and increase an operating speed, a power supply voltage of the IC may be reduced, and thus, the influence of the parasitic elements of the interconnections upon the IC may be further increased. Despite the parasitic elements, a memory device manufactured using a semiconductor process may be required to safely provide high performance according to requirements of various applications.

SUMMARY

One or more example embodiments provide a memory device, which provides high operation reliability despite parasitic elements, and an operating method of the memory device.

According to an aspect of an example embodiment, a memory device includes a cell array including a plurality of memory cells; n word lines extending in a first direction, wherein the n word lines are sequentially arranged in the cell array and include a first word line, an n-th word line, and a plurality of word lines interposed between the first word line and the n-th word line; a plurality of bit lines extending in a second direction in the cell array, wherein the second direction intersects with the first direction; a first power node located adjacent to the first word line; a second power node located adjacent to the n-th word line; a first switch connected between the first power node and the cell array; a write driver located adjacent to the n-th word line and connected to the plurality of bit lines; and a switch controller configured to control the first switch to isolate the first power node from the plurality of memory cells to block supplying of current from the first power node during a write operation on memory cells connected to the first word line, n being a positive integer.

According to an aspect of an example embodiment, a memory device includes a cell array including a plurality of memory cells; n word lines extending in a first direction, wherein the n word lines are sequentially arranged in the cell array and include a first word line, an n-th word line, and a plurality of word lines interposed between the first word line and the n-th word line; a plurality of bit lines extending in a second direction in the cell array, wherein the second direction intersects with the first direction; a first power node located adjacent to the first word line; a second power node located adjacent to the n-th word line; a first switch connected between the first power node and the cell array; a write driver located adjacent to the n-th word line and connected to the plurality of bit lines; and a switch controller configured to control the first switch to isolate the first power node from the plurality of memory cells to block receiving of current from the first power node during a write operation on memory cells connected to the first word line, n being a positive integer.

According to an aspect of an example embodiment, an operating method of a memory device with a cell array that includes a plurality of memory cells which are respectively connected to n word lines that are sequentially arranged and include a first word line, an n-th word line, and a plurality of word lines interposed between the first word line and the n-th word line, the memory device being configured to provide power to the cell array through a first path adjacent to the first word line and a second path adjacent to the n-th word line, the operating method including: receiving a write command, a write address, and write data; blocking the providing of power through one path, from among the first path and the second path, based on the write address; and activating one word line, from among the n word lines, based on the write address.

BRIEF DESCRIPTION OF THE DRAWINGS

The above, and other aspects, features and advantages will be more clearly understood from the following detailed description of example embodiments, taken in conjunction with the accompanying drawings in which.

DETAILED DESCRIPTION

Figure 1:
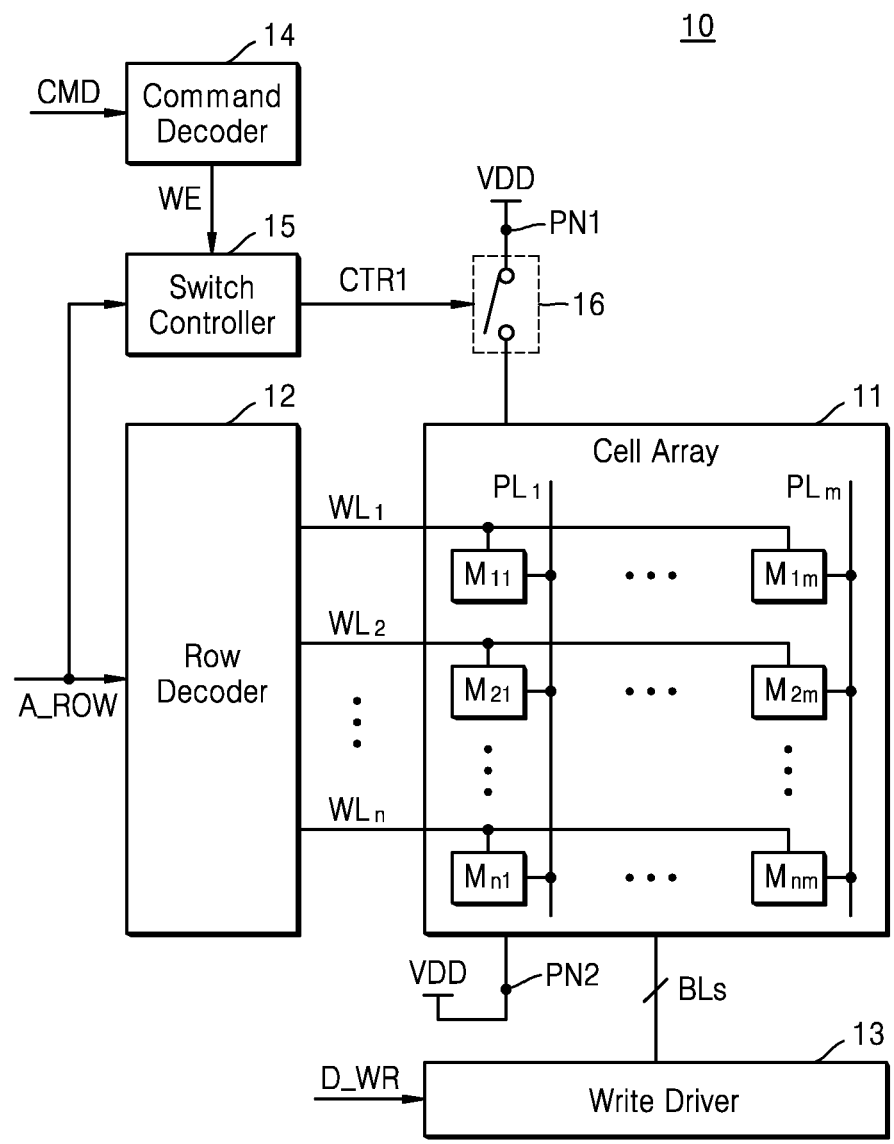
FIG. 1 is a diagram of a memory device according to an example embodiment.

FIG. 1 is a diagram of a memory device 10 according to an example embodiment. Specifically, the diagram of FIG. 1 illustrates the memory device 10, which includes a cell array 11, a row decoder 12, a write driver 13, a command decoder 14, a switch controller 15, and at least one switch 16. The memory device 10 may further include a column decoder, a read circuit, a data buffer, an address decoder, and a data input/output (I/O) circuit.

The memory device 10 may receive a command CMD, an address, and data from the outside. For example, the memory device 10 may receive a command CMD to perform a write operation (which may be referred to as a write command), an address (which may be referred to as a write address), and data (which may be referred to as write data) and store the received data in a region corresponding to the address. Also, the memory device 10 may receive a command CMD to perform a read operation (which may be referred to as a read command) and an address, and output data stored in the region corresponding to the address to the outside. The memory device 10 may be manufactured using a semiconductor process and include a stand-alone memory or an embedded memory manufactured along with other components using a semiconductor process as described below with reference to FIG. 16.

The cell array 11 may include a plurality of memory cells (e.g., $M_{11}$). In some example embodiments, the memory cells included in the cell array 11 may be memory cells of volatile memory devices, such as static random access memory (SRAM) and dynamic RAM (DRAM). In some example embodiments, the memory cells included in the cell array 11 may be memory cells of non-volatile memory devices, such as flash memory and resistive RAM (RRAM). Example embodiments will mainly be described with reference to SRAM cells as described below with reference to FIG. 2 but are not limited thereto.

Referring to FIG. 1, the memory cell included in the cell array 11 may be connected to one of first to n-th word lines $WL_1$ to $WL_n$ (here, n is an integer larger than 1), which are sequentially arranged in the cell array 11, and connected to one of first to m-th power lines $PL_1$ to $PL_m$ (here, m is an integer larger than 1). For example, the memory cell $M_{11}$ may be connected to the first word line $WL_1$ and the first power line $PL_1$, and a memory cell $M_{nm}$ may be connected to the n-th word line $WL_n$ and the m-th power line $PL_m$. Also, as described below with reference to FIG. 2, the memory cell included in the cell array 11 may be connected to at least one of a plurality of bit lines BLs. As shown in FIG. 1, the cell array 11 may receive a power supply voltage VDD through the at least one switch 16 from a first power node PN1 adjacent to the first word line $WL_1$ and receive a power supply voltage VDD from a second power node PN2 adjacent to the n-th word line $WL_n$. Thus, the supplying of current from the second power node PN2 may be maintained, while the supplying of current from the first power node PN1 may be selectively blocked.

Some of the plurality of memory cells may be selected by an activated word line of the first to n-th word lines $WL_1$ to $WL_n$. For example, m memory cells $M_{11}$ to $M_{1m}$ connected to the first word line $WL_1$ may be selected by an activated first word line $WL_1$. Depending on states of the plurality of bit lines BLs, data (i.e., write data) may be written to the m memory cells $M_{11}$ to $M_{1m}$, or signals corresponding to data (i.e., read data) stored in the m memory cells $M_{11}$ to $M_{1m}$ may be output through the plurality of bit lines BLs. The plurality of memory cells included in the cell array 11 may receive current through the first to m-th power lines $PL_1$ to $PL_m$. For example, the n memory cells $M_{11}$ to $M_{n1}$ may receive a positive supply voltage VDD through the first power line $PL_1$, and other n memory cells $M_{1m}$ to $M_{nm}$ may receive a positive supply voltage VDD through the m-th power line $PL_m$.

The row decoder 12 may receive a row address A_ROW and activate one word line of the first to n-th word lines $WL_1$ to $WL_n$ in response to the row address A_ROW. In some example embodiments, the memory device 10 may include an address decoder, which generates the row address A_ROW based on the address received together with the command CMD. In some example embodiments, the memory device 10 may further include a column decoder, which selects some of the plurality of bit lines BLs based on a column address received from the address decoder. In some example embodiments, the column decoder may be omitted, and all addresses received by the memory device 10 may be provided as the row address A_ROW by the address decoder to the row decoder 12.

The write driver 13 may be connected to the cell array 11 through the plurality of bit lines BLs and receive write data D_WR. The write driver 13 may output signals (e.g., voltages and/or currents) to the plurality of bit lines BLs based on the write data D_WR. Thus, the write driver 13 may write the write data D_WR to m memory cells, which are selected by an activated word line. As shown in FIG. 1, the write driver 13 may be located adjacent to the n-th word line $WL_n$, from among the first to n-th word lines $WL_1$ to $WL_n$. Thus, signals applied by the write driver 13 to the plurality of bit lines BLs may move longer distances during a write operation on the m memory cells $M_{11}$ to $M_{1m}$ connected to the first word line $WL_1$ than a write operation on m memory cells $M_{n1}$ to $M_{nm}$ connected to the n-th word line $WL_n$.

The command decoder 14 may receive the command CMD, decode the command CMD, and generate a write enable signal WE. For example, when the command CMD corresponds to the write command, the command decoder 14 may generate an activated write enable signal WE. Also, when the command decoder 14 receives a command CMD corresponding to the read command, the command decoder 14 may generate a deactivated write enable signal WE and also, generate an activated read enable signal. The components of the memory device 10 may recognize the write operation based on the activated write enable signal WE and recognize the read operation based on the activated read enable signal RE.

The at least one switch 16 may provide a positive supply voltage VDD to the cell array 11 via the first power node PN1 or block the providing of the positive supply voltage VDD via the first power node PN1, based on a first control signal CTR1. For example, the at least one switch 16 may be turned on in response to an activated first control signal CTR1 and provide a positive supply voltage VDD to the cell array 11. In contrast, the at least one switch 16 may be turned off in response to a deactivated first control signal CTR1 and block the providing of the positive supply voltage VDD to the cell array 11 via the first power node PN1.

The switch controller 15 may receive the row address A_ROW and the write enable signal WE and generate the first control signal CTR1. In some example embodiments, when the deactivated write enable signal WE is received, that is, while a write operation is not being performed, the switch controller 15 may generate an activated first control signal CTR1. Otherwise, while the write operation is being performed, that is, when the activated write enable signal WE is received, the switch controller 15 may generate an activated or deactivated first control signal CTR1. For example, the switch controller 15 may identify a write operation on the m memory cells $M_{11}$ to $M_{1m}$ based on the row address A_ROW and generate the deactivated first control signal CTR1.

The at least one switch 16 may electrically disconnect the first power node PN1 from the cell array 11 in response to the deactivated first control signal CTR1, and thus, the supplying of current from the first power node PN1 may be blocked. Thus, the m memory cells $M_{11}$ to $M_{1m}$ connected to the first word line $WL_1$ may receive a positive supply voltage VDD from the second power node PN2 through the first to m-th power lines $PL_1$ to $PL_m$, and current may be provided to the m memory cells $M_{11}$ to $M_{1m}$ through a relatively long path. As a result, as described below with reference to FIG. 2, signals applied to the plurality of bit lines BLs in order to write the m memory cells $M_{11}$ to $M_{1m}$ connected to the first word line $WL_1$ pass through the relatively long path, and the write operation on the m memory cells $M_{11}$ to $M_{1m}$ may be completed with increased reliability. In some example embodiments, based on the row address A_ROW, the switch controller 15 may generate the deactivated first control signal CTR1 not only during a write operation on the m memory cells $M_{11}$ to $M_{1m}$ connected to the first word line $WL_1$ but also during a write operation on memory cells, which are relatively far from the write driver 13, (e.g., m memory cells $M_{21}$ to $M_{2m}$ connected to a second word line $WL_2$). In some example embodiments, the switch controller 15 may generate the deactivated first control signal CTR1 during a write operation on memory cells connected to first to n/2-th word lines $WL_1$ to $WL_{n/2}$.

As described above, the influence of parasitic components may be canceled by controlling a path through which current is supplied to the cell array 11, and operation reliability (e.g., write reliability) of the memory device 10 may be improved. Also, because high operation reliability is achieved by using a simple structure, such as the switch controller 15 and the at least one switch 16, additional circuits configured to improve operation reliability may be omitted. As a result, the power consumption and area of the memory device 10 may be reduced. Furthermore, the performance and efficiency of a system (e.g., 160 in FIG. 16) including the memory device 10 may be increased due to high reliability and efficiency of the memory device 10.

Figure 2:
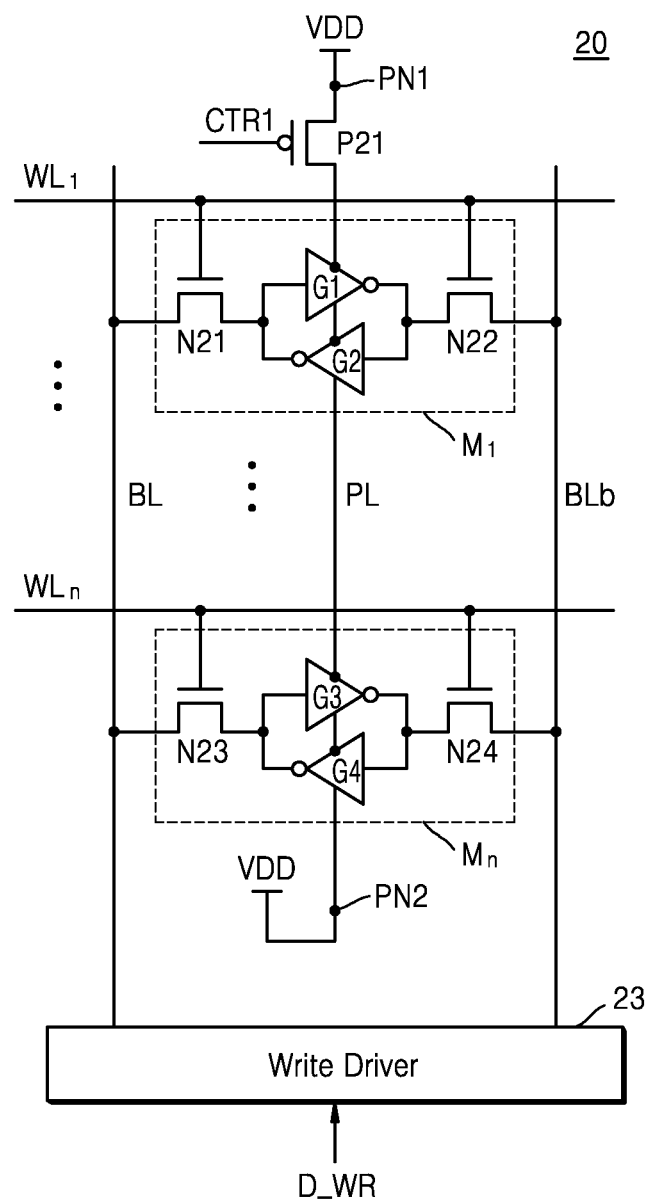
FIG. 2 is a diagram of a memory device according to an example embodiment.

FIG. 2 is a diagram of a memory device 20 according to an example embodiment. Specifically, the diagram of FIG. 2 illustrates memory cells connected to one pair of bit lines in the cell array 11 of FIG. 1 and examples of the at least one switch 16 of FIG. 1. As shown in FIG. 2, the memory device 20 may include first to n-th memory cells $M_1$ to $M_n$ connected to first to n-th word lines $WL_1$ to $WL_n$, respectively, and a write driver 23. Hereinafter, FIG. 2 will be described with reference to FIG. 1, and the same description as in FIG. 1 will be omitted from the description of FIG. 2.

In some example embodiments, the plurality of bit lines BLs of FIG. 1 may include a plurality of pairs of bit lines, and a memory cell may be connected to one pair of bit lines. For example, as shown in FIG. 2, the first to n-th memory cells $M_1$ to $M_n$ may be connected to a pair of bit lines, which includes a bit line BL and a complementary bit line (or a bit line bar) BLb. The write driver 23 may perform a write operation on the first to n-th memory cells $M_1$ to $M_n$ by applying complementary signals to the bit line BL and the complementary bit line BLb, respectively, based on write data D_WR.

Each of the first to n-th memory cells $M_1$ to $M_n$ may include cross-coupled inverters and include pass transistors connected to the bit line BL and the complementary bit line BLb, respectively. For example, the first memory cell $M_1$ may include first and second inverters G1 and G2, which are cross-coupled to each other, and first and second n-channel field effect transistors (NFETs) N21 and N22, which are connected to the bit line BL and the complementary bit line BLb, respectively. The first and second inverters G1 and G2 may be connected to a power line PL and receive a positive supply voltage VDD from the power line PL. Similarly, the n-th memory cell Mn may include third and fourth inverters G3 and G4 and third and fourth NFETs N23 and N24.

In some example embodiments, the memory device 20 may include a plurality of switches connected to a plurality of power lines, respectively. For example, as shown in FIG. 2, a first p-channel field effect transistor (PFET) P21 may be connected between the first power node PN1 and the power line PL, and electrically connect or disconnect the first power node PN1 to or from the power line PL in response to the first control signal CTR1. The first PFET P21 may connect the positive supply voltage VDD to the power line PL in response to an activated (i.e., low-level) first control signal CTR1 and isolate the first power node PN1 from the power line PL in response to a deactivated (i.e., high-level) first control signal CTR1. As described above with reference to FIG. 1, due to the deactivated first control signal CTR1 during the write operation on the first memory cell $M_1$, the providing of the positive supply voltage VDD from the first power node PN1 to the first memory cell $M_1$ may be blocked, and the first and second inverters G1 and G2 of the first memory cell $M_1$ may receive the positive supply voltage VDD from a second power node PN2.

Figure 3:
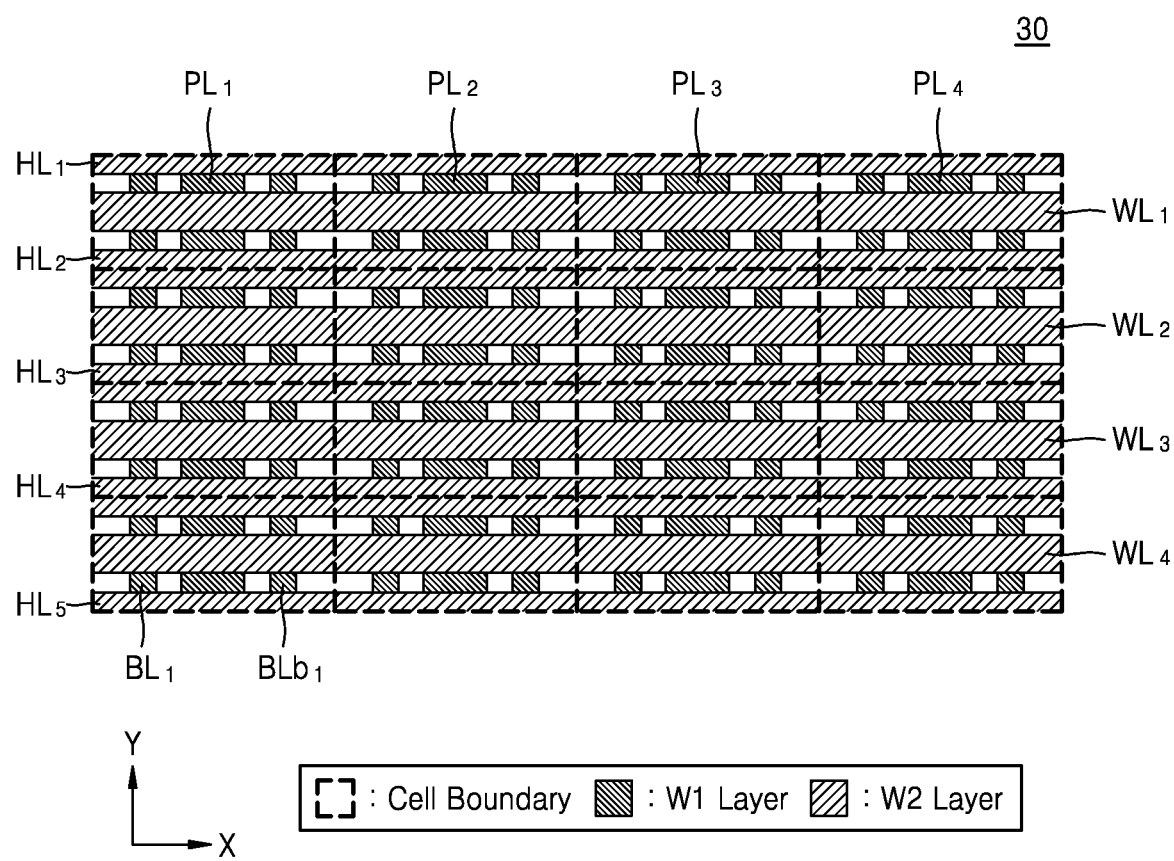
FIG. 3 illustrates an example of a layout of a cell array according to an example embodiment.

FIG. 3 illustrates an example of a layout of a cell array according to an example embodiment. Specifically, FIG. 3 illustrates two interconnection layers W1 and W2 and cell boundaries in some memory cells included in a cell array 30. Interconnection layers W1 and W2 may include an arbitrary conductor, for example, a metal.

Referring to FIG. 3, first to fourth word lines $WL_1$ to $WL_4$ may extend in parallel along an X-axis direction (which may be referred to as a first direction), and a plurality of bit lines (e.g., $BL_1$ and $BLb_1$) may extend in parallel along a Y-axis direction (which may be referred to as a second direction). A memory cell may be formed in a region where a word line intersects with a pair of bit lines. Also, first to fourth power lines $PL_1$ to $PL_4$ may extend in parallel along the Y-axis direction to be parallel to the plurality of bit lines (e.g., $BL_1$ and $BLb_1$). First to fifth horizontal lines $HL_1$ to $HL_5$ may extend in parallel along the X-axis direction to be parallel to the first to fourth word lines $WL_1$ to $WL_4$.

In some example embodiments, as described above with reference to FIGS. 1 and 2, a positive supply voltage VDD may be applied to the first to fourth power lines $PL_1$ to $PL_4$, while a ground potential VSS (or a negative supply voltage) may be applied to first to fifth horizontal lines $HL_1$ to $HL_5$. In some example embodiments, as described below with reference to FIGS. 5 and 6, the ground potential VSS may be applied to the first to fourth power lines $PL_1$ to $PL_4$, while the positive supply voltage VDD may be applied to the first to fifth horizontal lines $HL_1$ to $HL_5$. Furthermore, unlike that shown in FIG. 3, in some example embodiments, as described below with reference to FIG. 8, a memory cell may respectively receive a positive supply voltage VDD and a ground potential VSS from two power lines that extend in the Y direction.

Figure 4:
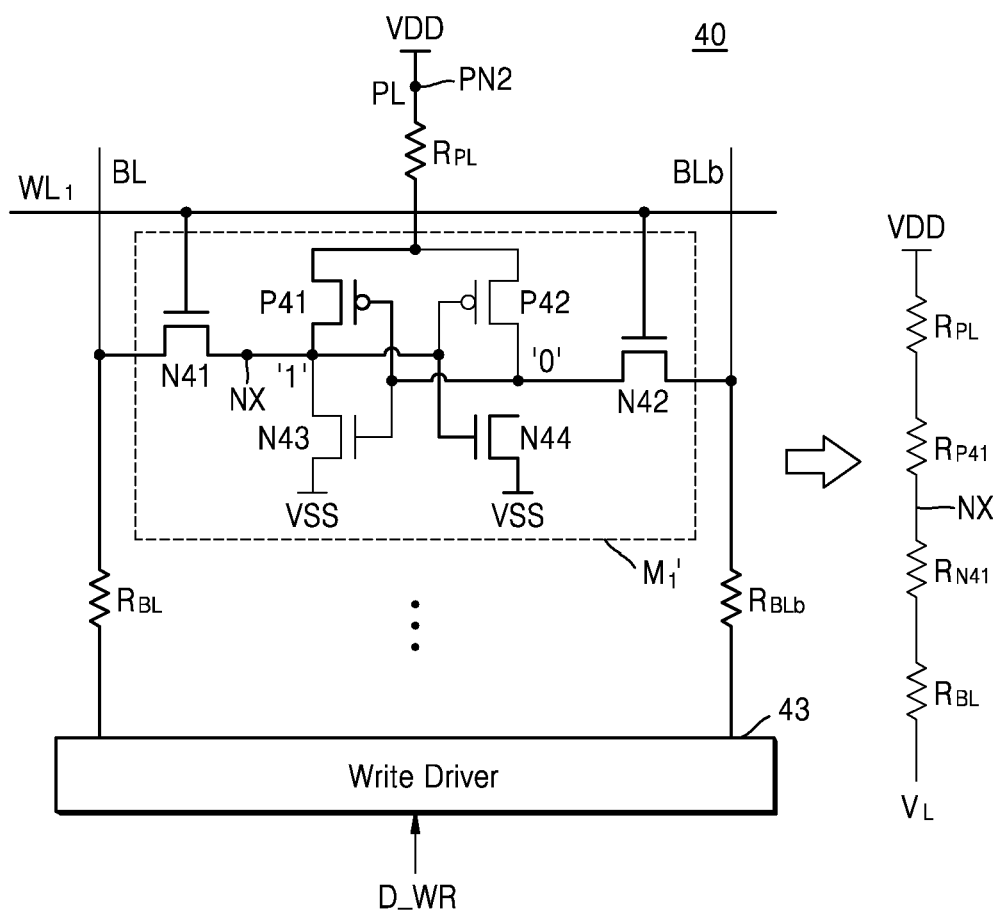
FIG. 4 is a diagram of an example of a write operation according to an example embodiment.

FIG. 4 is a diagram of an example of a write operation according to an example embodiment. Specifically, the left side of FIG. 4 illustrates an equivalent circuit of a memory device 40 during a write operation on a first memory cell $M_1'$ connected to a first word line $WL_1$, and the right side of FIG. 4 illustrates an equivalent circuit of a path through which current for a write operation moves in the memory device 40. Hereinafter, the same description as in FIG. 2 will be omitted from the description of FIG. 4.

Referring to the left side of FIG. 4, the memory device 40 may include a first memory cell $M_1'$ and a write driver 43. The first memory cell $M_1'$ may be connected to a first word line $WL_1$, a bit line BL, and a complementary bit line BLb. The first memory cell $M_1'$ may include first and second NFETs N41 and N42 corresponding to pass transistors, first and second PFETs P41 and P42, and third and fourth NFETs N43 and N44, which form a pair of cross-coupled inverters. In the example of FIG. 4, the first memory cell $M_1'$ may store a bit '1,' and a voltage of a node NX may be approximately equal to a positive supply voltage VDD. As described above with reference to FIGS. 1 and 2, during a write operation on the first memory cell $M_1'$, the first memory cell $M_1'$ may receive a positive supply voltage VDD from a second power node PN2. A resistance $R_{BL}$ may correspond to a resistance of the bit line BL from the write driver 43 to the first memory cell $M_1'$, and a resistance $R_{BLb}$ may correspond to a resistance of the complementary bit line BLb from the write driver 43 to the first memory cell $M_1'$. Also, a resistance $R_{PL}$ may correspond to a resistance of a power line PL from the second power node PN2 to the first memory cell $M_1'$.

To select the first memory cell $M_1'$, the first word line $WL_1$ may be activated or have a high level, and thus, the first and second NFETs N41 and N42 may be turned on. The write driver 43 may apply a low voltage $V_L$ to the bit line BL to write '0' to the first memory cell $M_1'$ based on write data D_WR. As indicated by bold lines in FIG. 4, current may flow from the positive supply voltage VDD to the write driver 43 through the power line PL, the first PFET P41, the first NFET N41, and the bit line BL. Thus, to write '0' to the first memory cell $M_1'$, it may be required to sufficiently drop the voltage of the node NX.

Referring to the right side of FIG. 4, when the low voltage VL applied by the write driver 43 to the bit line BL is approximately equal to a ground potential, a voltage $V_{NX}$ of the node NX may be defined as shown in Equation 1:

$$V_{NX} = \frac{R_{N41} + R_{BL}}{R_{PL} + R_{P41} + R_{N41} + R_{BL}} \times VDD \quad \text{[Equation 1]}$$

wherein a resistance $R_{P41}$ may correspond to an on-resistance of the first PFET P41, and a resistance $R_{N41}$ may correspond to an on-resistance of the first NFET N41. Although the resistance $R_{BL}$ may be high due to a length by which current passes through the bit line BL, the resistance $R_{PL}$ may also be high due to a length by which current flows through the power line PL, and the voltage $V_{NX}$ of the node NX may be sufficiently dropped to write '0' to the first memory cell $M_1'$ according to Equation 1. As a result, despite a parasitic element of the bit line BL, the write operation on the first memory cell $M_1'$ may be successfully completed.

Figure 5:
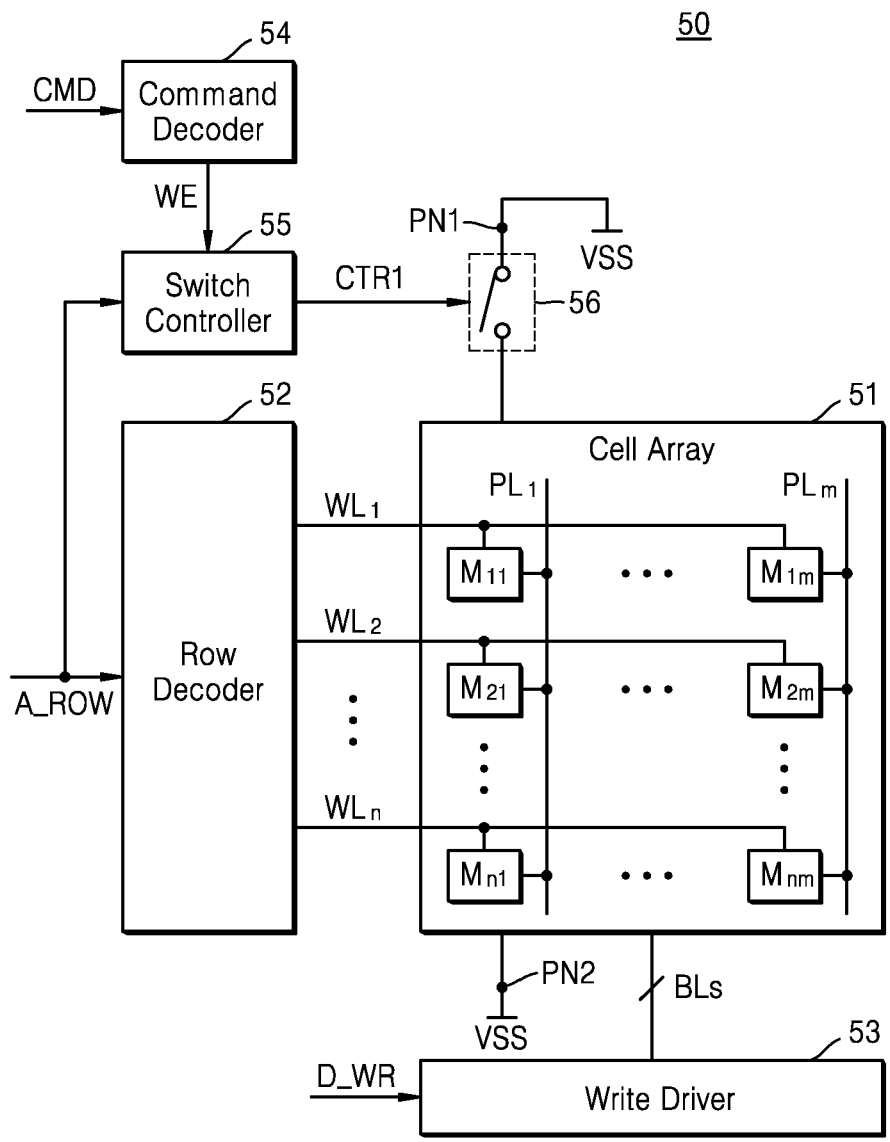
FIG. 5 is a diagram of a memory device according to an example embodiment.

FIG. 5 is a diagram of a memory device 50 according to an example embodiment. Specifically, the diagram of FIG. 5 illustrates the memory device 50, which includes a cell array 51, a row decoder 52, a write driver 53, a command decoder 54, a switch controller 55, and at least one switch 56 as components required for a write operation. As compared with the memory device 10 of FIG. 1, a ground potential VSS may be selectively provided from a first power node PN1 to the cell array 51 in the memory device 50 of FIG. 5. Hereinafter, the same description as in FIG. 1 will be omitted from the description of FIG. 5.

The cell array 51 may include a plurality of memory cells (e.g., $M_{11}$). The cell array 51 may receive a ground potential VSS through the at least one switch 56 from the first power node PN1 adjacent to a first word line $WL_1$ and receive a ground potential VSS from a second power node PN2 adjacent to an n-th word line $WL_n$. Thus, the second power node PN2 may always receive current consumed by the cell array 51, while the first power node PN1 may selectively receive current consumed by the cell array 51.

The row decoder 52 may activate one of first to n-th word lines $WL_1$ to $WL_n$ based on a row address A_ROW. The write driver 53 may apply signals to a plurality of bit lines BLs based on write data D_WR. The command decoder 54 may generate an activated write enable signal WE in response to a command CMD corresponding to a write command. The at least one switch 56 may be turned on in response to an activated first control signal CTR1 and provide a ground potential VSS to the cell array 51. In contrast, the at least one switch 56 may be turned off in response to a deactivated first control signal CTR1 and block the providing of the ground potential VSS to the cell array 51 via the first power node PN1. When a deactivated write enable signal WE is received, the switch controller 55 may generate the activated first control signal CTR1. Otherwise, when an activated write enable signal WE is received, the switch controller 55 may generate the activated or deactivated first control signal CTR1 based on the row address A_ROW.

In some example embodiments, the switch controller 55 may generate the deactivated first control signal CTR1 during a write operation on m memory cells $M_{11}$ to $M_{1m}$ connected to the first word line $WL_1$. The at least one switch 56 may electrically disconnect the first power node PN1 from the cell array 51 in response to the deactivated first control signal CTR1 and block the supplying of power by the first power node PN1. Thus, the m memory cells $M_{11}$ to $M_{1m}$ connected to the first word line $WL_1$ may receive a ground potential VSS from the second power node PN2 through the first to m-th power lines $PL_1$ to $PL_m$, and current may flow from the m memory cells $M_{11}$ to $M_{1m}$ to the second power node PN2 through a relatively long path. As a result, as described below with reference to FIG. 6, signals applied to the plurality of bit lines BLs in order to write the m memory cells $M_{11}$ to $M_{1m}$ connected to the first word line $WL_1$ pass through the relatively long path, and the write operation on the m memory cells $M_{11}$ to $M_{1m}$ may be completed with increased reliability. In some example embodiments, based on the row address A_ROW, the switch controller 55 may generate the deactivated first control signal CTR1 not only during a write operation on the m memory cells $M_{11}$ to $M_{1m}$ connected to the first word line $WL_1$ but also during a write operation on memory cells, which are relatively far from the write driver 53, (e.g., m memory cells $M_{21}$ to $M_{2m}$ connected to a second word line $WL_2$). In some example embodiments, the switch controller 55 may generate the deactivated first control signal CTR1 during a write operation on memory cells connected to the first to n/2-th word lines $WL_1$ to $WL_{n/2}$.

Figure 6:
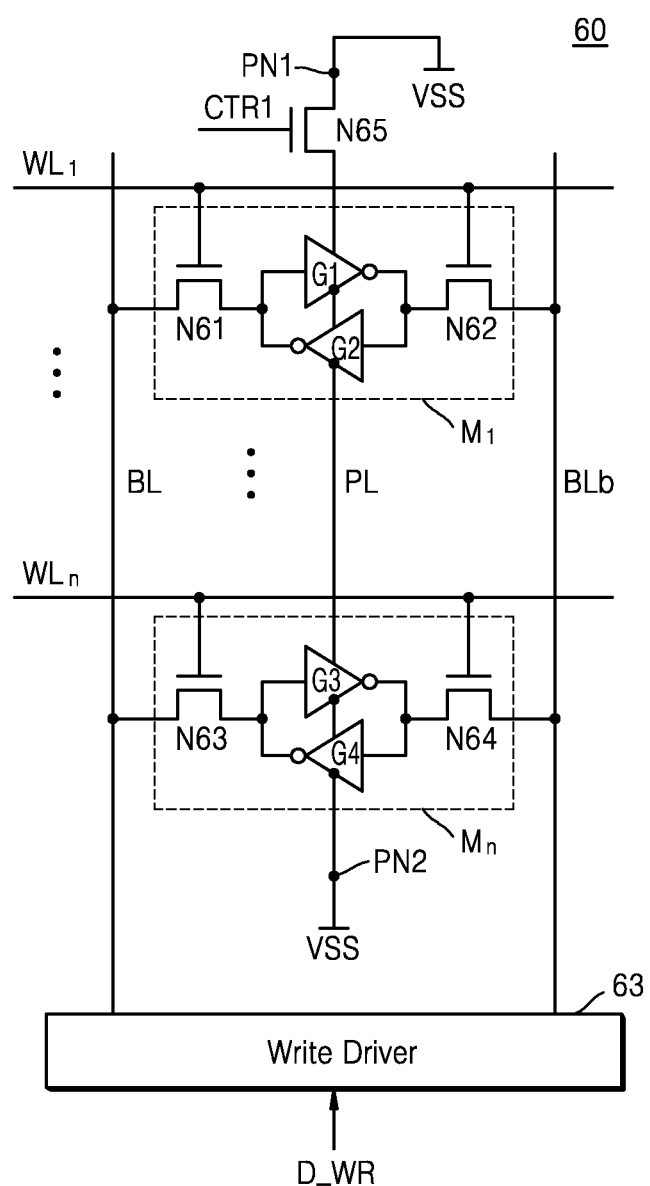
FIG. 6 is a diagram of a memory device according to an example embodiment.

FIG. 6 is a diagram of a memory device 60 according to an example embodiment. Specifically, the diagram of FIG. 6 illustrates examples of memory cells, which are connected to one pair of bit lines in the cell array 51 of FIG. 5, and an example of the at least one switch 56 of FIG. 5. As shown in FIG. 6, the memory device 60 may include first to n-th memory cells $M_1$ to $M_n$ connected to first to n-th word lines $WL_1$ to $WL_n$, respectively, and a write driver 63. Hereinafter, FIG. 6 will be described with reference to FIG. 5, and the same description as in FIGS. 2 and 5 will be omitted from the description of FIG. 6.

In some example embodiments, the plurality of bit lines BLs of FIG. 5 may include a plurality of pairs of bit lines, and a memory cell may be connected to one pair of bit lines. For example, as shown in FIG. 6, the first to n-th memory cells $M_1$ to $M_n$ may be connected to a pair of bit lines including a bit line BL and a complementary bit line (or bit line bar) BLb. The write driver 63 may perform a write operation on the first to n-th memory cells $M_1$ to $M_n$ by respectively applying complementary signals to the bit line BL and the complementary bit line BLb based on write data D_WR.

Each of the first to n-th memory cells $M_1$ to $M_n$ may include cross-coupled inverters and include pass transistors connected to the bit line BL and the complementary bit line BLb, respectively. For example, the first memory cell $M_1$ may include first and second inverters G1 and G2, which are cross-coupled to each other, and first and second NFETs N61 and N62, which are connected to the bit line BL and the complementary bit line BLb, respectively. The first and second inverters G1 and G2 may be connected to a power line PL and receive a ground potential VSS from the power line PL. Similarly, the n-th memory cell Mn may include third and fourth inverters G3 and G4 and third and fourth NFETs N63 and N64.

In some example embodiments, the memory device 60 may include a plurality of switches connected to a plurality of power lines, respectively. For example, as shown in FIG. 6, a fifth NFET N65 may be connected between a first power node PN1 and the power line PL, and electrically connect or disconnect the first power node PN1 to or from the power line PL in response to a first control signal CTR1. The fifth NFET N65 may transmit the ground potential VSS to the power line PL in response to an activated (i.e., high-level) first control signal CTR1 and block the ground potential VSS of the first power node PN1 to the power line PL in response to a deactivated (i.e., low-level) first control signal CTR1. As described above with reference to FIG. 5, due to the deactivated first control signal CTR1 during the write operation on the first memory cell $M_1$, the providing of the ground potential VSS from the first power node PN1 to the first memory cell $M_1$ may be blocked, and the first and second inverters G1 and G2 of the first memory cell $M_1$ may receive the ground potential VSS from the second power node PN2.

Figure 7:
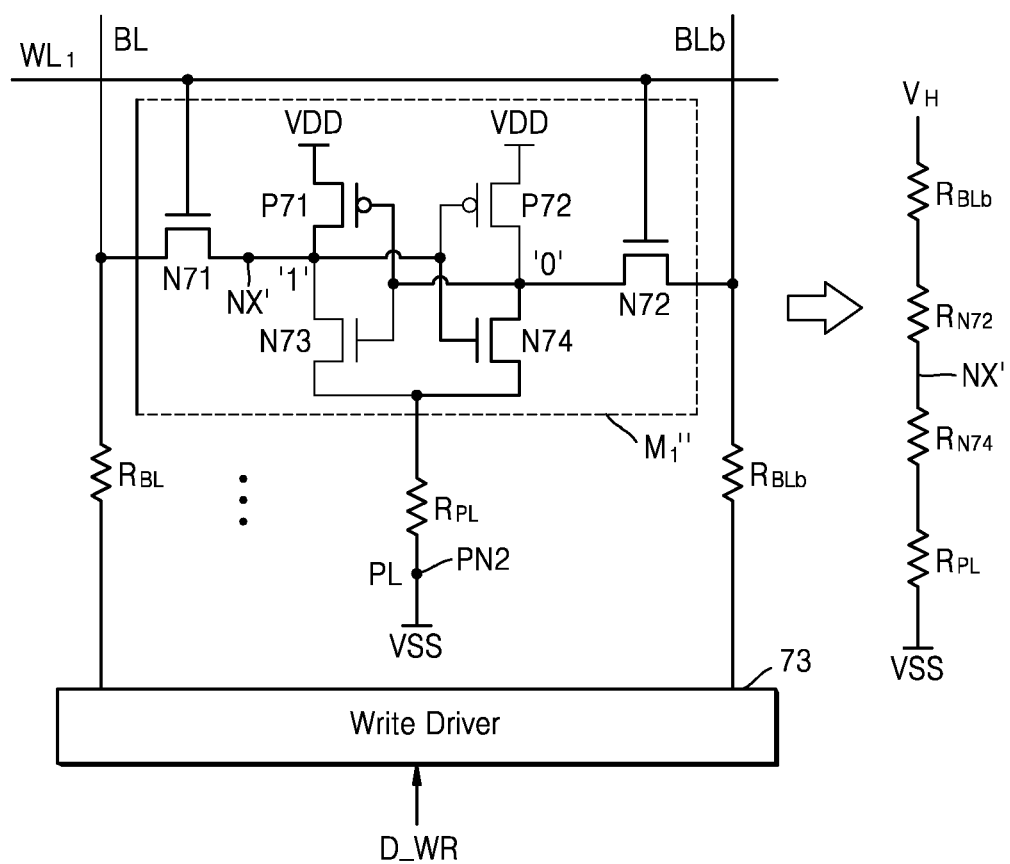
FIG. 7 is a diagram of an example of a write operation according to an example embodiment.

FIG. 7 is a diagram of an example of a write operation according to an example embodiment. Specifically, the left side of FIG. 7 illustrates an equivalent circuit of a memory device 70 during a write operation on a first memory cell $M_1''$ connected to a first word line $WL_1$, and the right side of FIG. 7 illustrates an equivalent circuit of a path through which current for the write operation moves in the equivalent circuit of the memory device 70. Hereinafter, the same description as in FIG. 6 will be omitted from the description of FIG. 7.

Referring to the left side of FIG. 7, the memory device 70 may include a first memory cell $M_1''$ and a write driver 73. The first memory cell $M_1''$ may be connected to a first word line $WL_1$, a bit line BL, and a complementary bit line BLb. The first memory cell $M_1''$ may include first and second NFETs N71 and N72 corresponding to pass transistors and first and second PFETs P71 and P72 and third and fourth NFETs N73 and N74, which form a pair of cross-coupled inverters. In the example of FIG. 7, the first memory cell $M_1''$ may store a bit '1,' and a voltage of a node NX' may be approximately equal to a ground potential VSS. As described above with reference to FIGS. 5 and 6, the first memory cell $M_1''$ may receive the ground potential VSS from a second power node PN2 during the write operation on the first memory cell $M_1''$. A resistance $R_{BL}$ may correspond to a resistance of the bit line BL from the write driver 73 to the first memory cell $M_1''$, and a resistance $R_{BLb}$ may correspond to a resistance of the complementary bit line BLb from the write driver 73 to the first memory cell $M_1''$. Also, a resistance $R_{PL}$ may correspond to a resistance of a power line PL from the second power node PN2 to the first memory cell $M_1''$.

To select the first memory cell $M_1''$, the first word line WL1 may be activated or have a high level, and thus, the first and second NFETs N71 and N72 may be turned on. The write driver 73 may apply a high voltage $V_H$ to the complementary bit line BLb to write '0' to the first memory cell $M_1''$ based on write data D_WR. As indicated by bold lines in FIG. 7, current may flow from the write driver 73 to the ground potential VSS through the complementary bit line BLb, the second NFET N72, the fourth NFET N74, and the power line PL. Thus, to write '0' to the first memory cell $M_1''$, it may be required to sufficiently boost the voltage of the node NX'.

Referring to the right side of FIG. 7, when the high voltage $V_H$ applied by the write driver 73 to the bit line BL is approximately equal to a positive supply voltage VDD, a voltage $V_{NX'}$ of the node NX' may be defined as shown in Equation 2:

$$V_{NX'} = \frac{R_{N74} + R_{PL}}{R_{BLb} + R_{N72} + R_{N74} + R_{PL}} \times VDD \quad \text{[Equation 2]}$$

wherein a resistance $R_{N72}$ may correspond to an on-resistance of the second NFET N72, and a resistance $R_{N74}$ may correspond to an on-resistance of the fourth NFET N74. Although the resistance $R_{BLb}$ may be high due to a length by which current passes through the complementary bit line BLb, the resistance $R_{PL}$ may also be high due to a length by which current flows through the power line PL, and the voltage $V_{NX'}$ of the node NX' may be sufficiently boosted to write '0' to the first memory cell $M_1''$ according to Equation 2. As a result, despite a parasitic element of the complementary bit line BLb, the write operation on the first memory cell $M_1''$ may be successfully completed.

Figure 8:
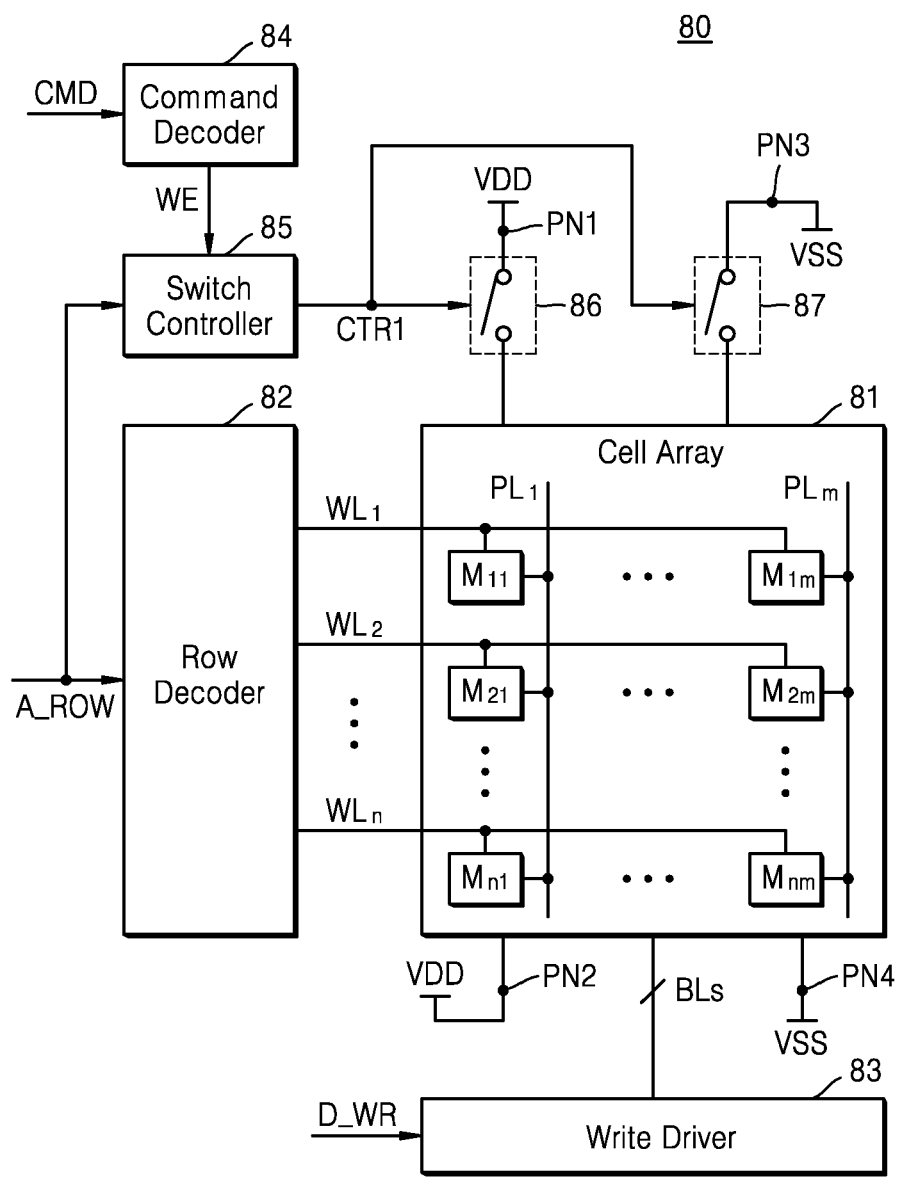
FIG. 8 is a diagram of a memory device according to an example embodiment.

FIG. 8 is a diagram of a memory device 80 according to an example embodiment. Specifically, FIG. 8 illustrates the memory device 80, which includes a cell array 81, a row decoder 82, a write driver 83, a command decoder 84, a switch controller 85, at least one first switch 86, and at least one second switch 87. As compared to the memory devices 10 and 50 of FIGS. 1 and 5, in the memory device 80 of FIG. 8, a positive supply voltage VDD may be selectively provided from a first power node PN1 to the cell array 81, and a ground potential VSS may be selectively provided from a third power node PN3 to the cell array 81. Hereinafter, the same description as in FIGS. 1 and 5 may be omitted from the description of FIG. 8.

The cell array 81 may include a plurality of memory cells (e.g., $M_{11}$). The cell array 81 may receive a power supply voltage VDD through the at least one first switch 86 from the first power node PN1 adjacent to a first word line $WL_1$ and receive a positive supply voltage VDD from a second power node PN2 adjacent to an n-th word line $WL_n$. Also, the cell array 81 may receive the ground potential VSS through the at least one second switch 87 from the third power node PN3 adjacent to the first word line $WL_1$ and receive a ground potential VSS from a fourth power node PN4 adjacent to the n-th word line $WL_n$. Thus, the supplying of current from the second power node PN2 and the receiving of current from the fourth power node PN4 may be maintained, while the supplying of current from the first power node PN1 and the receiving of current from the third power node PN3 may be selectively blocked.

The row decoder 82 may activate one of the first to n-th word lines $WL_1$ to $WL_n$ based on a row address A_ROW. The write driver 83 may apply signals to a plurality of bit lines BLs based on write data D_WR. The command decoder 84 may generate an activated write enable signal WE in response to a command CMD corresponding to a write command. The at least one first switch 86 and the at least one second switch 87 may be turned on in response to an activated first control signal CTR1 and provide each of the positive supply voltage VDD and the ground potential VSS to the cell array 81. In contrast, the at least one first switch 86 and the at least one second switch 87 may be turned off in response to a deactivated first control signal CTR1 and block the first node PN1 providing of the positive supply voltage VDD and the third node PN3 providing the ground potential VSS to the cell array 81. When the deactivated write enable signal WE is received, a switch controller 85 may generate the activated first control signal CTR1. Otherwise, when the activated write enable signal WE is received, the switch controller 85 may generate an activated or deactivated first control signal CTR1 based on the row address A_ROW.

In some example embodiments, the switch controller 85 may generate the deactivated first control signal CTR1 during a write operation on m memory cells $M_{11}$ to $M_{1m}$ connected to the first word line $WL_1$. Thus, the at least one first switch 86 and the at least one second switch 87 may electrically disconnect the cell array 81 from the first and third power nodes PN1 and PN3, and the supplying and receiving of current from the first and third power nodes PN1 and PN3 may be blocked. As a result, as described above with reference to FIGS. 1 and 5, signals applied to the plurality of bit lines BLs in order to write the m memory cells $M_{11}$ to $M_{1m}$ connected to the first word line $WL_1$ pass through the relatively long path, and the write operation on the m memory cells $M_{11}$ to $M_{1m}$ may be completed with increased reliability. In some example embodiments, the at least one first switch 86 may include at least one PFET, the at least one second switch 87 may include at least one NFET, and the at least one first switch 86 and the at least one second switch 87 may be respectively inverted based on the first control signal CTR1.

Figure 9A:
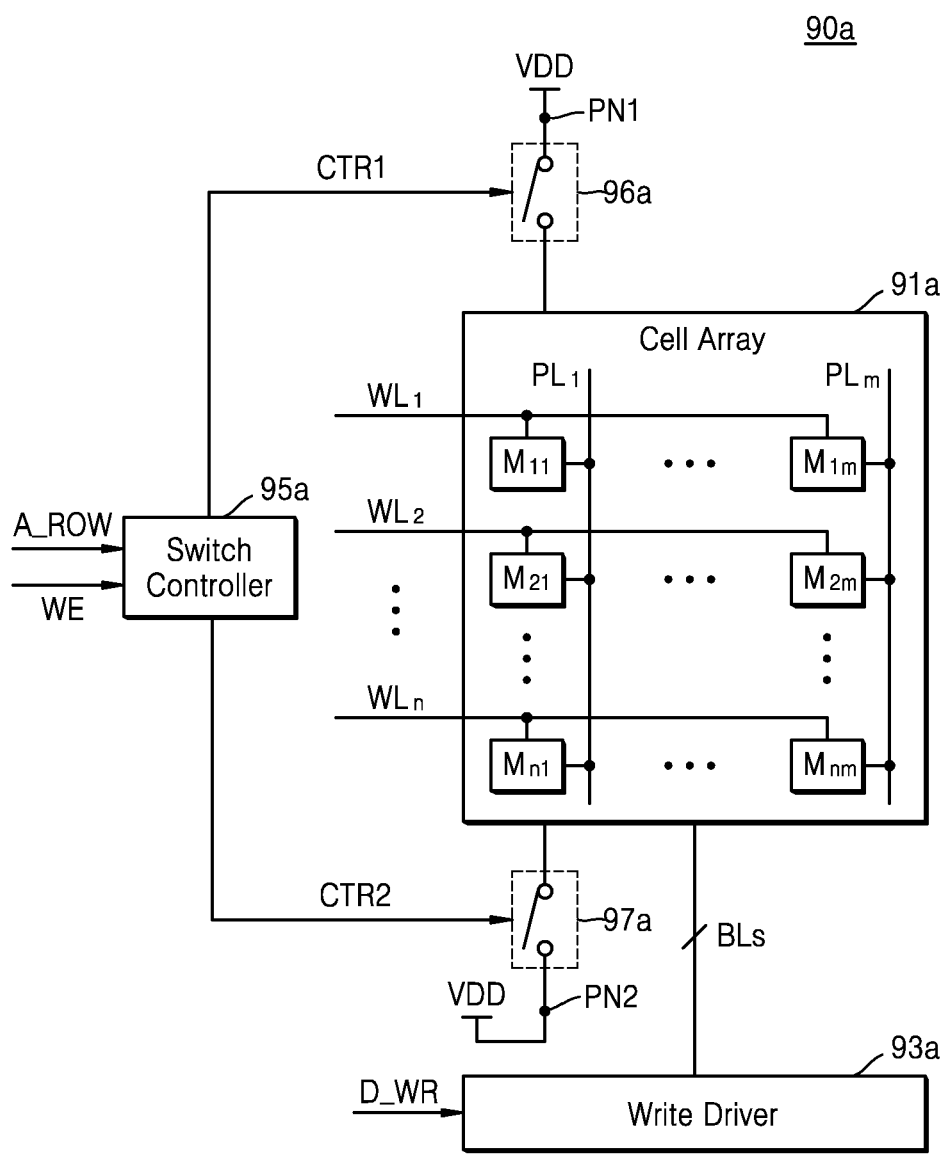
FIGS. 9A and 9B are diagrams of examples of a memory device according to example embodiments.
Figure 9B:
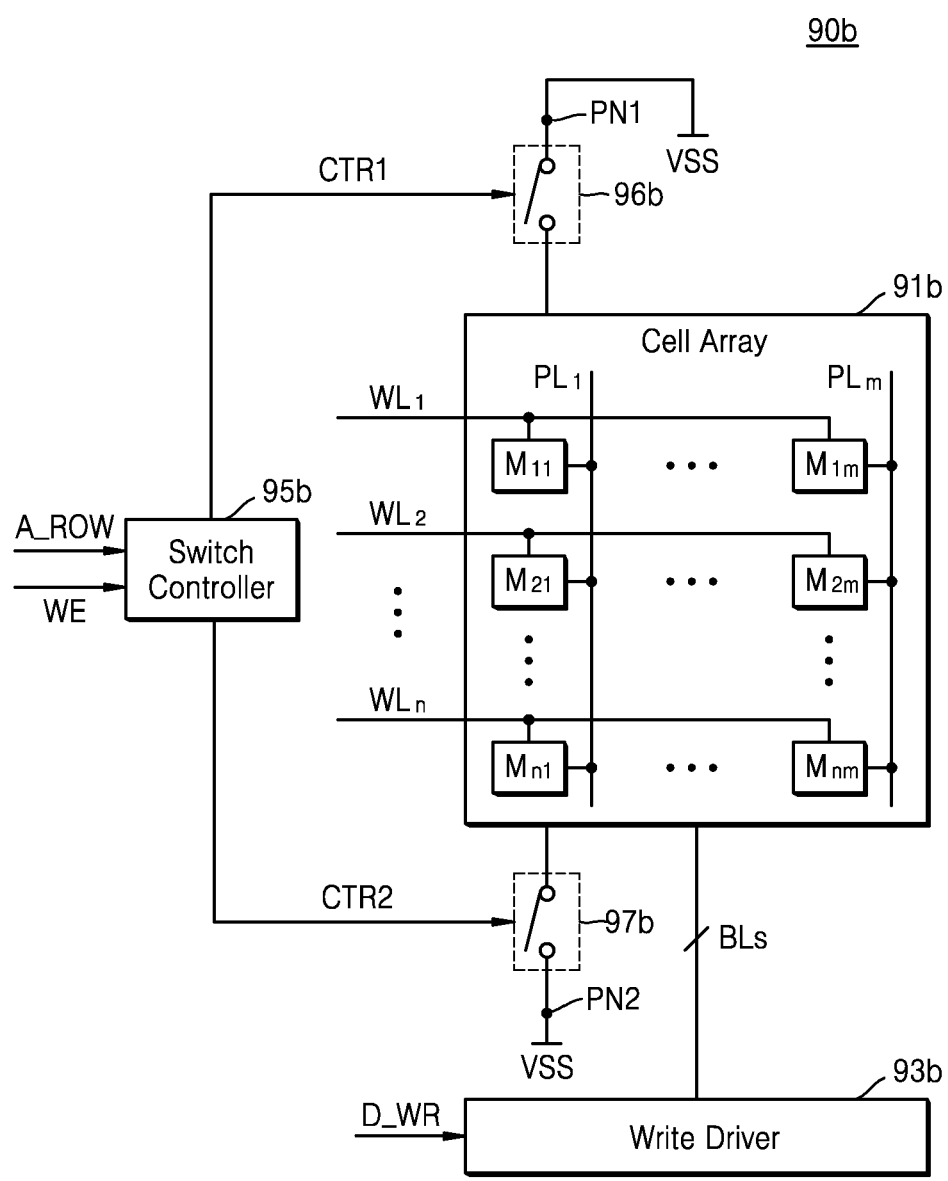

FIGS. 9A and 9B are diagrams of examples of a memory device according to example embodiments. Specifically, the diagram of FIG. 9A illustrates a memory device 90a, which includes switches 96a and 97a configured to selectively provide a positive supply voltage VDD to a cell array 91a, and the diagram of FIG. 9B illustrates a memory device 90b, which includes switches 96b and 97b configured to selectively provide a ground potential VSS to a cell array 91b.

Referring to FIG. 9A, similar to the memory device 10 of FIG. 1, the memory device 90a may include the cell array 91a, a write driver 93a, a switch controller 95a, and at least one first switch 96a. The memory device 90a may also and include at least one second switch 97a. The write driver 93a may apply signals to a plurality of bit lines BLs based on write data D_WR.

The cell array 91a may include a plurality of memory cells (e.g., $M_{11}$). The cell array 91a may receive a positive supply voltage VDD through at least one first switch 96a from a first power node PN1 adjacent to a first word line $WL_1$ and receive a positive supply voltage VDD through at least one second switch 97a from a second power node PN2 adjacent to an n-th word line $WL_n$. As used herein, a path from the first power node PN1 adjacent to the first word line $WL_1$ to the cell array 91a may be referred to as a first path, and a path from the second power node PN2 adjacent to the n-th word line $WL_n$ to the cell array 91a may be referred to as a second path.

The at least one first switch 96a may electrically connect the first power node PN1 to the cell array 91a in response to an activated first control signal CTR1 and electrically disconnect the first power node PN1 from the cell array 91a in response to a deactivated first control signal CTR1. Also, the at least one second switch 97a may electrically connect the second power node PN2 to the cell array 91a in response to an activated second control signal CTR2 and electrically disconnect the second power node PN2 from the cell array 91a in response to a deactivated second control signal CTR2.

In some example embodiments, the switch controller 95a may generate the deactivated first control signal CTR1 and the activated second control signal CTR2 during a write operation on m memory cells $M_{11}$ to $M_{1m}$ connected to the first word line $WL_1$. In addition, the switch controller 95a may generate the activated first control signal CTR1 and the deactivated second control signal CTR2 during a write operation on m memory cells $M_{n1}$ to $M_{nm}$ connected to the n-th word line $WL_n$. Thus, not only the write operation on the m memory cells $M_{11}$ to $M_{1m}$ connected to the first word line $WL_1$, which is relatively far from the write driver 93a, but also the write operation on the m memory cells $M_{n1}$ to $M_{nm}$ connected to the n-th word line $WL_n$, which is relatively close to the write driver 93a, may be performed with increased reliability. For example, the memory cell $Mn_1$ connected to the n-th word line $WL_n$ and a first power line $PL_1$ may receive the positive supply voltage VDD from the first power node PN1 through the first power line $PL_1$. Thus, a sufficiently dropped voltage may be generated in the memory cell $Mn_1$ due to an increased resistance of the first power line $PL_1$.

Referring to FIG. 9B, similar to the memory device 50 of FIG. 5, the memory device 90b may include the cell array 91b, a write driver 93b, a switch controller 95b, and at least one first switch 96b. The memory device 90b may also include at least one second switch 97b. The write driver 93b may apply signals to a plurality of bit lines BLs based on write data D_WR.

The cell array 91b may include a plurality of memory cells (e.g., $M_{11}$). The cell array 91b may receive a ground potential VSS through the at least one first switch 96b from a first power node PN1 adjacent to a first word line $WL_1$ and receive a ground potential VSS through the at least one second switch 97b from a second power node PN2 adjacent to an n-th word line $WL_n$. The at least one first switch 96b may electrically connect the first power node PN1 to the cell array 91b in response to an activated first control signal CTR1 and also, electrically disconnect the first power node PN1 from the cell array 91b in response to a deactivated first control signal CTR1. Also, the at least one second switch 97b may electrically connect the second power node PN2 to the cell array 91b in response to an activated second control signal CTR2 and also, electrically disconnect the second power node PN2 from the cell array 91b in response to a deactivated second control signal CTR2.

In some example embodiments, the switch controller 95b may generate the deactivated first control signal CTR1 and the activated second control signal CTR2 during a write operation on m memory cells $M_{11}$ to $M_{1m}$ connected to the first word line $WL_1$. Also, the switch controller 95b may generate the activated first control signal CTR1 and the deactivated second control signal CTR2 during a write operation on m memory cells $M_{n1}$ to $M_{nm}$ connected to the n-th word line $WL_n$. Thus, not only the write operation on the m memory cells $M_{11}$ to $M_{1m}$ connected to the first word line $WL_1$, which is relatively far from the write driver 93b, but also the write operation on the m memory cells $M_{n1}$ to $M_{nm}$ connected to the n-th word line $WL_n$, which is relatively close to the write driver 93b, may be performed with increased reliability. For example, the memory cell $M_{n1}$ connected to the n-th word line $WL_n$ and a first power line $PL_1$ may receive the ground potential VSS from the first power node PN1 through the first power line $PL_1$. Thus, a sufficiently boosted voltage may be generated in the memory cell $M_{n1}$ due to an increased resistance of the first power line $PL_1$.

In some example embodiments, the switch controllers 95a and 95b of FIGS. 9A and 9B may generate the deactivated first control signal CTR1 and the activated second control signal CTR2 during a write operation on first to n/2-th word lines $WL_1$ to $WL_{n/2}$ and generate the activated first control signal CTR1 and the deactivated second control signal CTR2 during a write operation on memory cells connected to (n/2+1)-th to n-th word lines $WL_{n/2+1}$ to $WL_n$. In some example embodiments, similar to that described above with reference to FIG. 8, the memory device may include all of the switches, that is, the first switch 96a, the second switch 97a, the first switch 96b, and the second switch 97b of FIGS. 9A and 9B, and the positive supply voltage VDD and the ground potential VSS may be simultaneously provided from power nodes or blocked according to a position of a memory cell to be written.

Figure 10A:
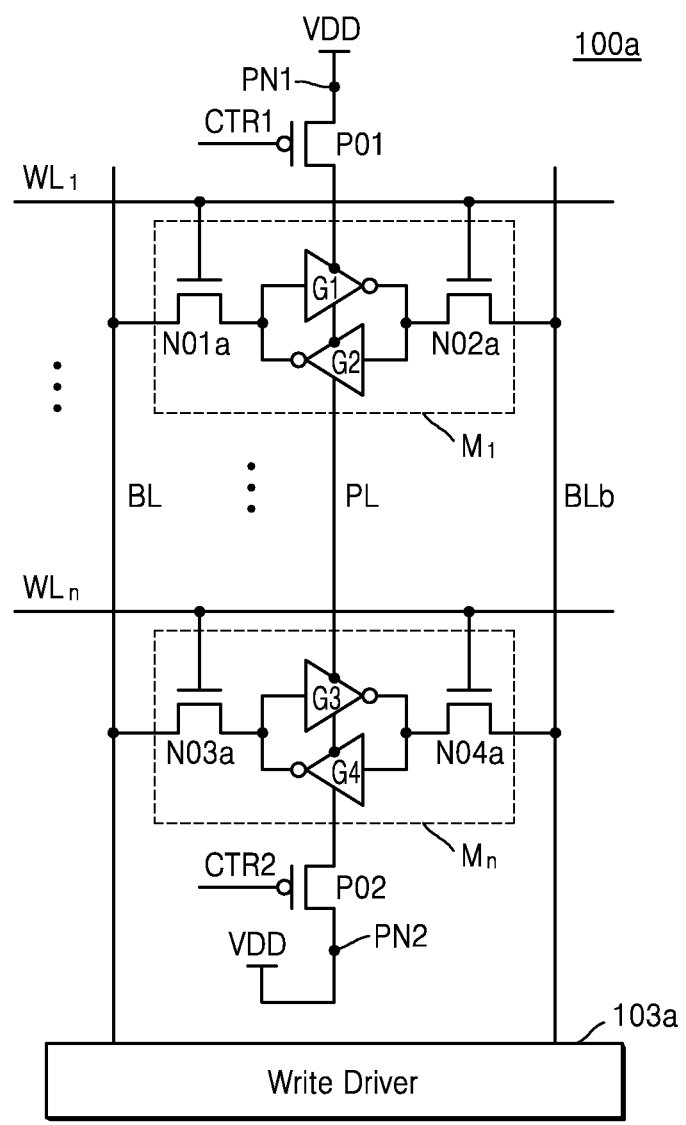
FIGS. 10A and 10B are diagrams of examples of a memory device according to example embodiments.
Figure 10B:
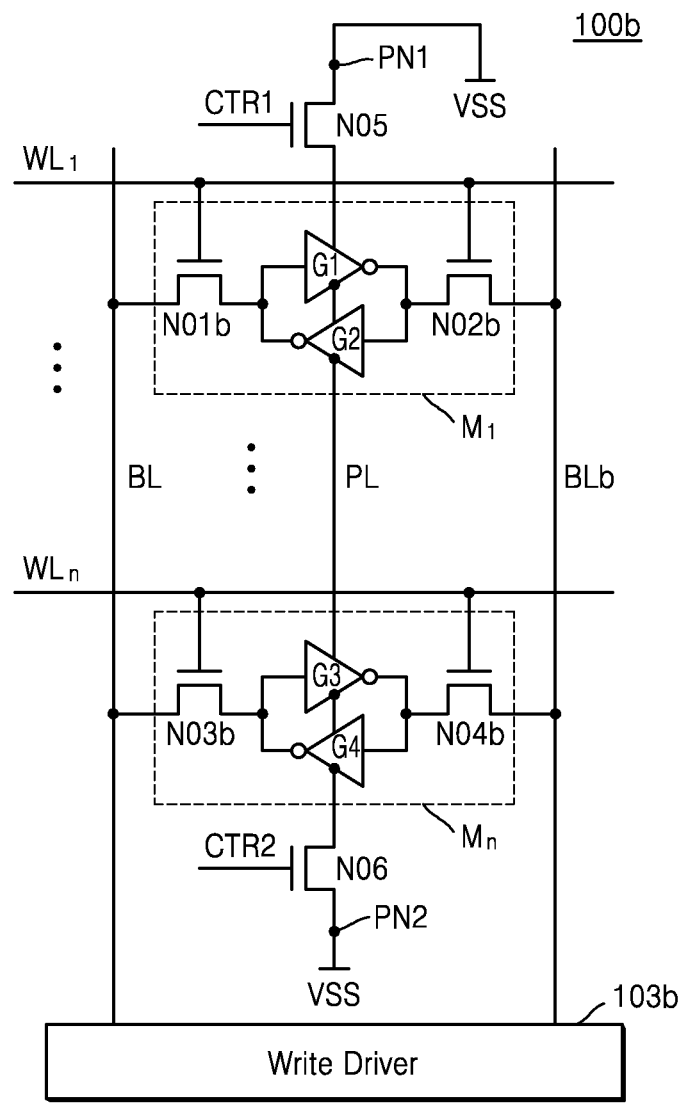

FIGS. 10A and 10B are diagrams of examples of a memory device according to example embodiments. Specifically, the diagram of FIG. 10A illustrates examples of memory cells, which are connected to one pair of bit lines in the cell array 91a of FIG. 9A, the at least one first switch 96a, and the at least one second switch 97a. The diagram of FIG. 10B illustrates examples of memory cells, which are connected to one pair of bit lines in the cell array 91b of FIG. 9B, the at least one first switch 96b, and the at least one second switch 97b. The same description as those provided above will be omitted from the descriptions of FIGS. 10A and 10B.

Referring to FIG. 10A, a memory device 100a may include first to n-th memory cells $M_1$ to $M_n$, which are connected to first to n-th word lines $WL_1$ to $WL_n$, respectively, and connected to a bit line BL and a complementary bit line BLb, and include a write driver 103a. In some example embodiments, the first to n-th memory cells $M_1$ to $M_n$ may be SRAM cells. For example, the first memory cell $M_1$ may include first and second inverters G1 and G2, which are cross-coupled to each other, and first and second NFETs N01a and N02a, which serve as pass transistors. The first and second inverters G1 and G2 may be connected to a power line PL and receive a positive supply voltage VDD from the power line PL. Similarly, the n-th memory cell $M_n$ may include third and fourth inverters G3 and G4 and third and fourth NFETs N03a and N04a.

In some example embodiments, the memory device 100a may include a plurality of switches connected to a plurality of power lines, respectively. For example, as shown in FIG. 10A, a first PFET P01 may be connected between a first power node PN1 to which a positive supply voltage VDD is applied and the power line PL, and electrically connect or disconnect the first power node PN1 to or from the power line PL in response to a first control signal CTR1. Also, a second PFET P02 may be connected to a second power node PN2 to which a positive supply voltage VDD is applied and the power line PL, and electrically connect or disconnect the second power node PN2 to and from the power line PL in response to a second control signal CTR2. In some example embodiments, the second control signal CTR2 may be an inverted version of the first control signal CTR1.

Referring to FIG. 10B, a memory device 100b may include first to n-th memory cells $M_1$ to $M_n$, which are connected to first to n-th word lines $WL_1$ to $WL_n$, respectively, and connected to a bit line BL and a complementary bit line BLb, and include a write driver 103b. In some example embodiments, the first to n-th memory cells $M_1$ to $M_n$ may be SRAM cells. For example, the first memory cell $M_1$ may include first and second inverters G1 and G2, which are cross-coupled to each other, and first and second NFETs N01b and N02b, which serve as pass transistors. The first and second inverters G1 and G2 may be connected to a power line PL and receive a ground potential VSS from the power line PL. Similarly, the n-th memory cell $M_n$ may include third and fourth inverters G3 and G4 and third and fourth NFETs N03b and N04b.

In some example embodiments, the memory device 100b may include a plurality of switches connected to a plurality of power lines, respectively. For example, as shown in FIG. 10B, a fifth NFET N05 may be connected between a first power node PN1 to which a ground potential VSS is applied and the power line PL, and electrically connect or disconnect the first power node PN1 to or from the power line PL in response to a first control signal CTR1. Also, a sixth NFET N06 may be connected between a second power node PN2 to which a ground potential VSS is applied and the power line PL, and electrically connect or disconnect the second power node PN2 from the power line PL in response to a second control signal CTR2. In some example embodiments, the second control signal CTR2 may be an inverted version of the first control signal CTR1.

Figure 11A:
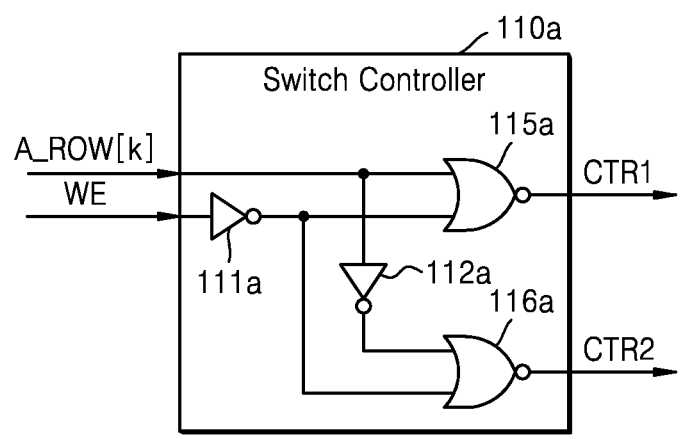
FIGS. 11A and 11B are diagrams of examples of a switch controller according to example embodiments.
Figure 11B:
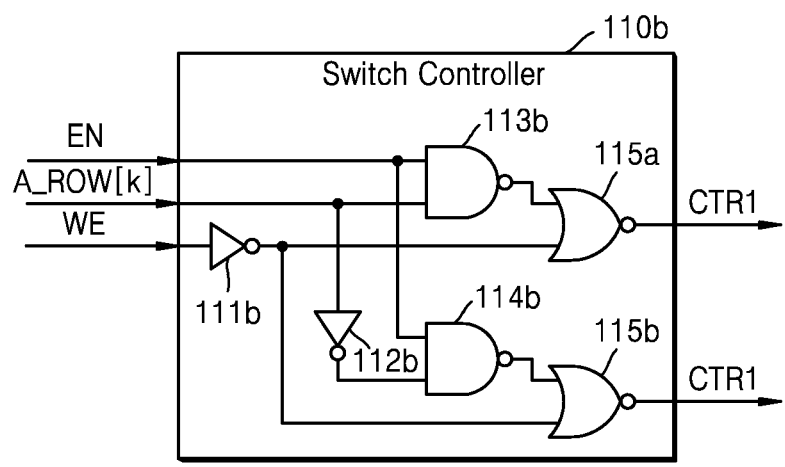

FIGS. 11A and 11B are diagrams of examples of a switch controller according to example embodiments. Specifically, FIGS. 11A and 11B illustrate switch controllers 110a and 110b configured to generate first and second control signals CTR1 and CTR2, which are provided to the first and second PFETs P01 and P02 of FIG. 10A, respectively. As described above with reference to FIG. 10A, the first and second PFETs P01 and P02 of FIG. 10A may be turned on in response to a first and second control signal CTR1 and CTR2 having low-level and turned off in response to a the first and second control signal CTR1 and CTR2 having high-level. Hereinafter, FIGS. 11A and 11B will be described with reference to FIGS. 11A and 11B.

Referring to FIG. 11A, the switch controller 110a may include first and second inverters 111a and 112a and first and second NOR gates 115a and 116a, and receive a write enable signal WE and a most significant bit (MSB) of a row address A_ROW. For example, as shown in FIG. 11A, the switch controller 110a may receive an MSB A_ROW[k] of a k-bit row address A_ROW ($2^k$=n). During a write operation on memory cells connected to first to n/2-th word lines $WL_1$ to $WL_{n/2}$, from among first to n-th word lines $WL_1$ to $WL_n$, the switch controller 110a may generate first and second control signals CTR1 and CTR2 such that a positive supply voltage VDD is supplied from a second power node PN2, and a first power node PN1 is isolated. Thus, as shown in FIG. 11A, the switch controller 110a may generate a first control signal CTR1 having high-level and a second control signal CTR2 having low-level in response to a MSB A_ROW[k] having low-level and a write enable signal WE having high-level. Also, during a write operation on memory cells connected to (n/2+1)-th to n-th word lines $WL_{n/2+1}$ to $WL_n$, from among the first to n-th word lines $WL_1$ to $WL_n$, the switch controller 110a may generate the first and second control signals CTR1 and CTR2 such that the positive supply voltage VDD is supplied from the first power node PN1, and the second power node PN2 is isolated. Thus, as shown in FIG. 11A, the switch controller 110a may generate a first control signal CTR1 having low-level and a second control signal CTR2 having high-level in response to a MSB A_ROW[k] having high-level and a write enable signal WE having high-level.

Referring to FIG. 11B, similar to the switch controller 110a of FIG. 11A, the switch controller 110b may include first and second inverters 111b and 112b and first and second NOR gates 115a and 116a. Additionally, the switch controller 110b may further include first and second NAND gates 113b and 114b. The switch controller 110b may receive a write enable signal WE and an MSB A_ROW[k] of a row address A_ROW and further receive an enable signal EN. The switch controller 110b may operate in the same manner as the switch controller 110a of FIG. 11A in response to an enable signal EN having high-level and also, generate first and second control signals CTR1 and CTR2 having low-level in response to an enable signal EN having low-level. That is, when the enable signal EN has a low level, the first to n-th memory cells $M_1$ to $M_n$ may receive a power supply voltage VDD from first and second power nodes PN1 and PN2 regardless of the row address A_ROW and the write enable signal WE.

Figure 12:
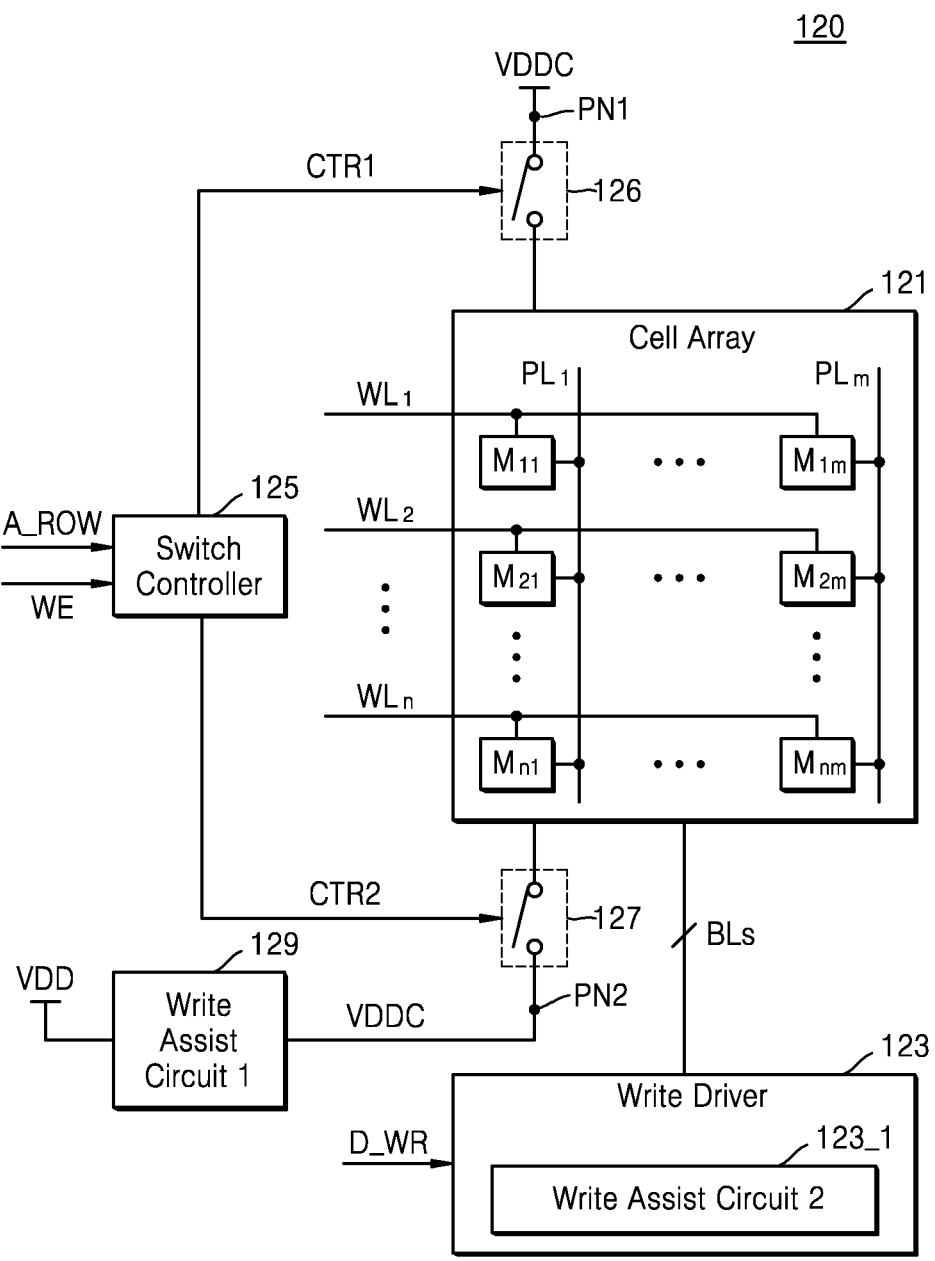
FIG. 12 is a diagram of a memory device according to an example embodiment.

FIG. 12 is a diagram of a memory device 120 according to an example embodiment. As shown in FIG. 12, similar to the memory device 90a of FIG. 9A, the memory device 120 may include a cell array 121, a write driver 123, a switch controller 125, at least one first switch 126, and at least one second switch 127. Additionally, the memory device 120 may further include a first write assist circuit 129. Hereinafter, the same description as in FIG. 9A will be omitted from the description of FIG. 12.

In some example embodiments, the memory device 120 may further include the first write assist circuit 129 to increase the reliability of a write operation. The at least one first switch 126, the at least one second switch 127, and the switch controller 125 may assist in the write operation along with the first write assist circuit 129. For example, the first write assist circuit 129 may generate a positive voltage VDDC, which is to be provided to the cell array 121, from a positive supply voltage VDD, and assist the write operation by slightly reducing the positive voltage VDDC during the write operation. As shown in FIG. 12, the positive voltage VDDC may be applied to each of first and second power nodes PN1 and PN2, and the at least one first switch 126 and the at least one second switch 127 may selectively provide the positive voltage VDDC to the cell array 121 in response to first and second control signals CTR1 and CTR2. In some example embodiments, as shown in FIG. 12, the write driver 123 may include a second write assist circuit 123_1. The second write assist circuit 123_1 may assist the write operation by lowering a low voltage applied to some of a plurality of bit lines BLs (e.g., below a ground potential) during the write operation. The at least one first switch 126, the at least one second switch 127, and the switch controller 125 may assist the write operation independently of the second write assist circuit 123_1.

Figure 13:
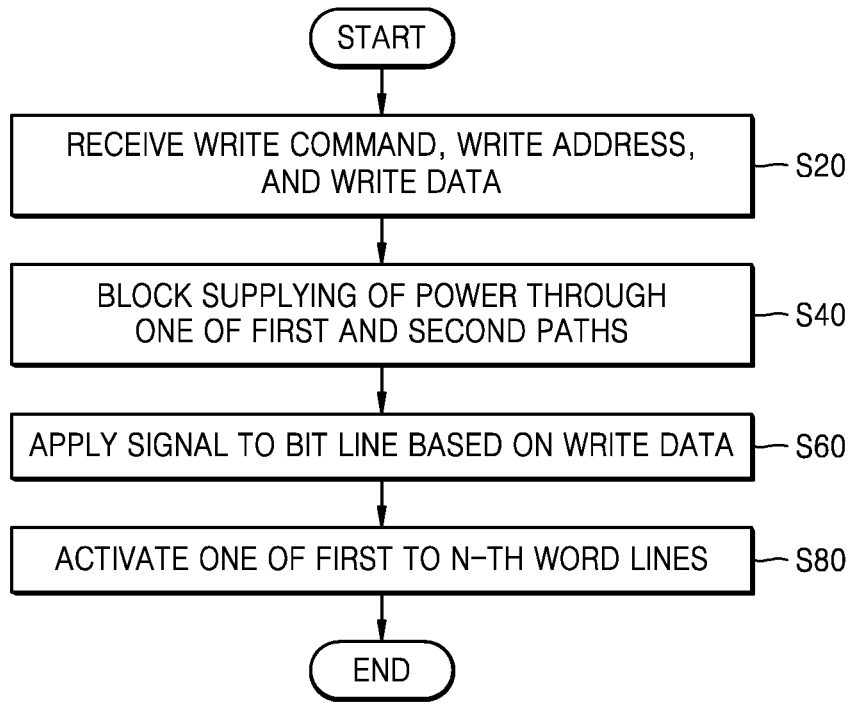
FIG. 13 is a flowchart of an example of a method of writing data, according to an example embodiment.

FIG. 13 is a flowchart of an example of a method of writing data, according to an example embodiment. In some example embodiments, the method of FIG. 13 may be performed by the memory device 90a of FIG. 9A and be referred to as an operating method of the memory device 90a. As shown in FIG. 13, the method of writing data may include a plurality of operations (e.g., S20, S40, S60, and S80). Hereinafter, FIG. 13 will be described with reference to FIG. 9A.

In operation S20, an operation of receiving a write command, a write address, and write data may be performed. For example, the memory device 90a may initialize a write operation for writing write data to a region corresponding to the write address in response to the write command.

In operation S40, an operation of blocking the supplying of power through one of first and second paths may be performed. For example, the cell array 91a may receive power through the first path including a first power node PN1 adjacent to a first word line $WL_1$ and the at least one first switch 96a, and through a second path including a second power node PN2 adjacent to an n-th word line $WL_n$ and the at least one second switch 97a. The switch controller 95a may block the supplying of power through one of the first and second paths, based on the write address, and thus, a resistance of a power line may provide increased reliability for the write operation. An example of operation S40 will be described below with reference to FIG. 14.

In operation S60, an operation of applying a signal to a bit line based on write data D_WR may be performed. For example, the write driver 93a may apply a high voltage $V_H$ or a low voltage $V_L$ to each of a plurality of bit lines BLs based on the write data D_WR. In some example embodiments, the plurality of bit lines BLs may include a plurality of pairs of bit lines, each of which includes a bit line BL and a complementary bit line BLb, and the write driver 93a may apply complementary signals to a pair of bit lines.

In operation S80, an operation of activating one of first to n-th word lines $WL_1$ to $WL_n$ may be performed. For example, a row decoder (e.g., 12 of FIG. 1) may activate one of first to n-th word lines $WL_1$ to $WL_n$, based on a row address A_ROW, and select memory cells to which data is to be written. In some example embodiments, operation S80 may be performed before operation S60 or performed in parallel (concurrently) with operation S60.

Figure 14:
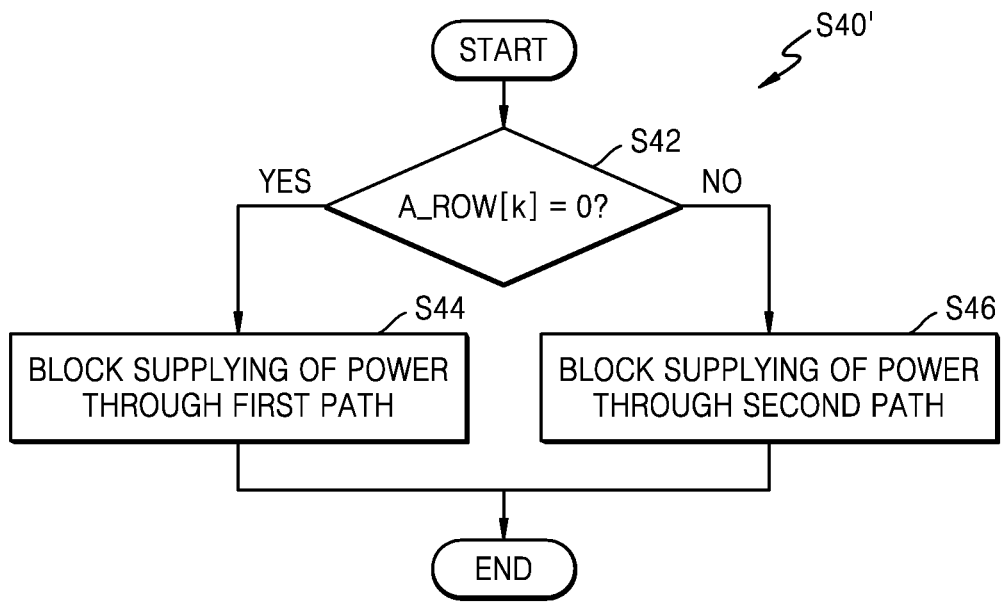
FIG. 14 is a flowchart of an example of a method of writing data, according to an example embodiment.

FIG. 14 is a flowchart of an example of a method of writing data, according to an example embodiment. Specifically, the flowchart of FIG. 14 illustrates an example of operation S40 of FIG. 13. As described above with reference to FIG. 13, an operation of blocking the supplying of power through one of first and second paths may be performed in operation S40' of FIG. 14. As shown in FIG. 14, operation S40' may include a plurality of operations (e.g., S42, S44, and S46). Hereinafter, FIG. 14 will be described with reference to FIG. 9A.

Referring to FIG. 14, in operation S42, an operation of checking an MSB A_ROW[k] of a row address A_ROW may be performed. As shown in FIG. 14, when the MSB A_ROW[k] of the row address A_ROW is '0,' that is, when one of first to n/2-th word lines $WL_1$ to $WL_{n/2}$ is activated, operation S44 may be subsequently performed. In operation S44, an operation of blocking the supplying of power through the first path may be performed. For example, the switch controller 95a may generate a deactivated first control signal CTR1, and the at least one first switch 96a may be turned off. Otherwise, when the MSB A_ROW[k] of the row address A_ROW is '1,' that is, when one of (n/2+1)-th to n-th word lines $WL_{n/2+1}$ to $WL_n$ is activated, operation S46 may be subsequently performed. For example, the switch controller 95a may generate a deactivated second control signal CTR2, and the at least one second switch 97a may be turned off.

Figure 15:
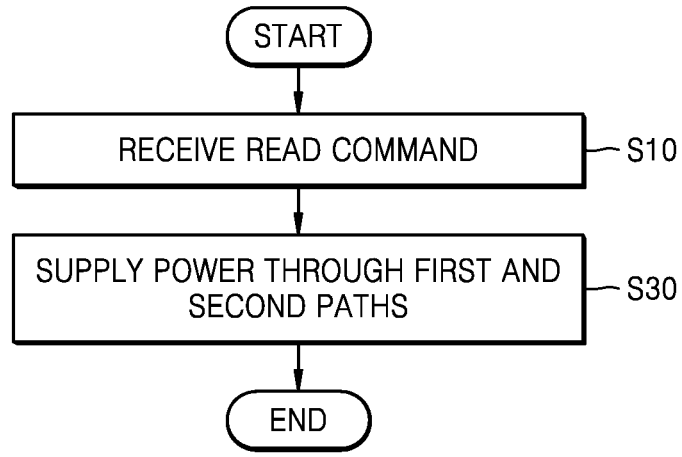
FIG. 15 is a flowchart of an example of an operating method of a memory device, according to an example embodiment.

FIG. 15 is a flowchart of an example of a method of operating a memory device according to an example embodiment. In some example embodiments, a cell array 91a may receive power through first and second paths during an operation that is different from a write operation. FIG. 15 illustrates an example of a read operation, which is an example of the operation that is different from the write operation. In some example embodiments, the method of FIG. 15 may be performed by the memory device 90a of FIG. 9A. Hereinafter, FIG. 15 will be described with reference to FIG. 9A.

In operation S10, an operation of receiving a read command may be performed. For example, the memory device 90a may receive an address along with a command corresponding to the read command and initialize an operation of reading data stored in a region corresponding to the address, in response to the read command.

In operation S30, an operation of supplying power through the first and second paths may be performed. For example, the switch controller 95a may receive a deactivated write enable signal WE due to the read command, and generate activated first and second control signals CTR1 and CTR2. Thus, at least one first switch 96a and at least one second switch 97a may be turned on, and the cell array 91a may receive power through the first and second paths.

Figure 16:
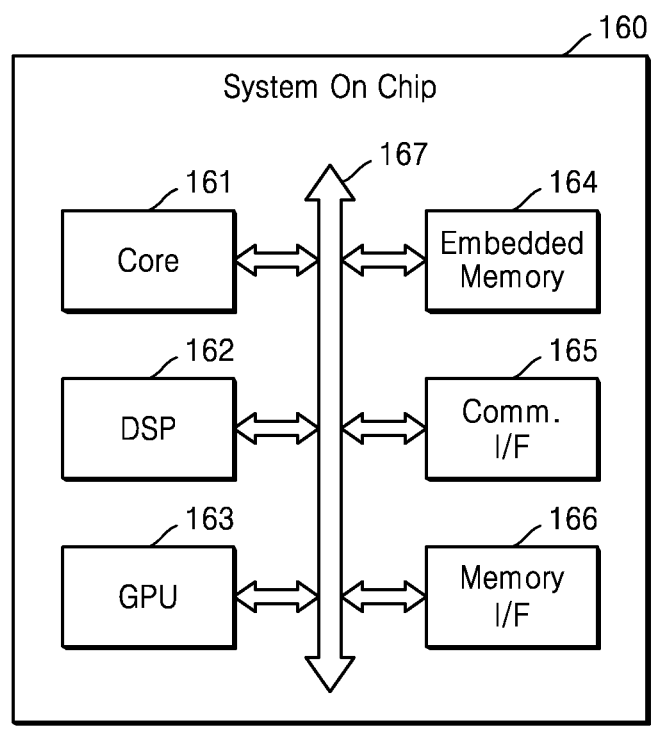
FIG. 16 is a diagram of a System-on-Chip (SoC) including a memory device, according to an example embodiment.

FIG. 16 is a diagram of a System-on-Chip (SoC) 160 including a memory device, according to an example embodiment. The SoC 160 may refer to an integrated circuit (IC) in which components of a computing system or another electronic system are integrated. For example, an application processor (AP), which is an example of the SoC 160, may include a processor and components for other functions. As shown in FIG. 16, the SoC 160 may include a core 161, a digital signal processor (DSP) 162, a graphic processing unit (GPU) 163, an embedded memory 164, a communication interface 165, and a memory interface 166. Components of the SoC 160 may communicate with each other through a bus 167.

The core 161 may process instructions and control operations of components included in the SoC 160. For example, the core 161 may process a series of instructions, run an operating system, and execute applications on the operating system. The DSP 162 may process a digital signal (e.g., a digital signal provided by the communication interface 165), and generate useful data. The GPU 163 may generate data for an image output through a display device, based on image data provided from the embedded memory 164 or the memory interface 166, or encode the image data. In some example embodiments, the memory device may be included in the core 161, the DSP 162, and/or the GPU 163 as a cache memory and/or a buffer. Thus, due to high reliability and efficiency of the memory device, the core 161, the DSP 162, and/or the GPU 163 may also have high reliability and efficiency.

The embedded memory 164 may store data required for operations of the core 161, the DSP 162, and the GPU 163. In some example embodiments, the embedded memory 164 may include a memory device according to an example embodiment. Thus, the embedded memory 164 may provide a reliable write operation and have reduced area and power consumption. As a result, the operation reliability and efficiency of the SoC 200 may be improved.

The communication interface 165 may provide an interface for a communication network or one-to-one communication. The memory interface 166 may provide an interface for an external memory (e.g., dynamic random access memory (DRAM) and flash memory) of the SoC 160.

While example embodiments have been particularly shown and described with reference to the accompanying drawings, it will be understood that various changes in form and details may be made therein without departing from the spirit and scope of the following claims.

What is claimed is:

1. A memory device comprising:
   a cell array comprising a plurality of memory cells;
   n word lines extending in a first direction, wherein the n word lines are sequentially arranged in the cell array and comprise a first word line, an n-th word line, and a plurality of word lines interposed between the first word line and the n-th word line;
   a plurality of bit lines extending in a second direction in the cell array, wherein the second direction intersects with the first direction;
   a plurality of power lines extending in the second direction in the cell array and electrically connected to the plurality of memory cells;
   a first power node located adjacent to the first word line;
   a second power node located adjacent to the n-th word line;
   a first switch connected between the first power node and at least one power line of the plurality of power lines, and configured to be turned on or turned off based on a first control signal;
   a write driver located adjacent to the n-th word line and connected to the plurality of bit lines; and
   a switch controller configured to receive a row address and generate the first control signal based on the row address,
   wherein the switch controller is further configured to turn off the first switch in response to the row address indicating the first word line during a write operation on memory cells, while a connection between the at least one power line and the second power node is maintained, and
   wherein n is a positive integer.

2. The memory device of claim 1, wherein the switch controller is further configured to control the first switch to turn off during a write operation on memory cells connected to the first to n/2-th word lines.

3. The memory device of claim 1, further comprising a second switch connected between the second power node and the at least one power line,
   wherein the switch controller is further configured to control the second switch to isolate the second power node from the at least one power line during a write operation on memory cells connected to the n-th word line.

4. The memory device of claim 3, wherein the switch controller is further configured to control the second switch to turn off during a write operation based on the row address indicating (n/2+1)-th to n-th word lines.

5. The memory device of claim 1, wherein the first power node and the second power node are configured to provide a positive supply voltage,
wherein the plurality of bit lines comprise a plurality of pairs of bit lines, and
wherein the write driver is configured to apply a ground potential to one bit line of each of the plurality of pairs of bit lines during a write operation.

6. The memory device of claim 1, further comprising:
a third power node located adjacent to the first word line;
a fourth power node nodes located adjacent to the n-th word line; and
a third switch connected between the third power node and the cell array,
wherein the first power node and the second power node are configured to provide a positive supply voltage,
wherein the third power node and the fourth power node nodes are configured to provide a ground potential, and
wherein the switch controller is further configured to control the third switch to isolate the third power node from the plurality of memory cells to block receiving of current from the cell array during the write operation on the memory cells connected to the first word line.

7. The memory device of claim 1, further comprising a row driver configured to activate one of the n word lines based on the row address.

8. The memory device of claim 1, wherein each of the plurality of memory cells comprises a static random access memory (SRAM) cell comprising a pair of cross-coupled inverters.

9. The memory device of claim 1, wherein the switch controller is further configured to control the first switch to electrically connect the first power node to the at least one power line during a write operation on memory cells connected to the n-th word line and during a read operation on the plurality of memory cells.

10. A memory device comprising:
a cell array comprising a plurality of memory cells;
n word lines extending in a first direction, wherein the n word lines are sequentially arranged in the cell array and comprise a first word line, an n-th word line, and a plurality of word lines interposed between the first word line and the n-th word line;
a plurality of bit lines extending in a second direction in the cell array, wherein the second direction intersects with the first direction;
a plurality of power lines extending in the second direction in the cell array and electrically connected to the plurality of memory cells;
a first power node located adjacent to the first word line;
a second power node located adjacent to the n-th word line;
a first switch connected between the first power node and at least one power line of the plurality of power lines, and configured to be turned on or turned off based on a first control signal;
a second switch connected between the first power node and the at least one power line and configured to be turned on or turned off based on a second control signal;
a write driver located adjacent to the n-th word line and connected to the plurality of bit lines; and
a switch controller configured to receive a row address and generate the first control signal and the second control signal based on the row address,
wherein the switch controller is further configured to turn on the first switch and turn off the second switch in response to the row address indicating n-th word line during a write operation on memory cells, and
wherein n is a positive integer.

11. The memory device of claim 10, wherein the switch controller is further configured to turn off the first switch during a write operation on memory cells connected to the first word line.

12. The memory device of claim 10, wherein the first power node and the second power node are configured to provide a ground potential,
wherein the plurality of bit lines comprise a plurality of pairs of bit lines, and
wherein the write driver is configured to apply a positive supply voltage to one bit line of each of the plurality of pairs of bit lines during a write operation.

13. An operating method of a memory device with a cell array that includes a plurality of memory cells which are respectively connected to n word lines that are sequentially arranged and include a first word line, an n-th word line, a plurality of word lines interposed between the first word line and the n-th word line, and a plurality of power lines electrically connected to the plurality of memory cells; the memory device being configured to provide power to the plurality of power lines through a first path adjacent to the first word line and a second path adjacent to the n-th word line, the operating method comprising:
receiving a write command, a write address, and write data;
blocking the providing of power through one path, from among the first path and the second path, while maintaining the providing of power through another path, from among the first path and the second path, based on the write address indicating the first word line; and
activating one word line, from among the n word lines, based on the write address.

14. The operating method of claim 13, wherein the blocking of the supplying of power comprises blocking the supplying of power through the first path based on the write address indicating the first word line.

15. The operating method of claim 13, wherein the blocking of the supplying of power comprises blocking the supplying of power through the second path based on the write address indicating the n-th word line.

16. The operating method of claim 13, wherein the blocking of the supplying of power comprises:
blocking the supplying of power through the first path based on the write address indicating one word line from among the first to n/2-th word lines; and
blocking the supplying of power through the second path based on the write address indicating one word line from among the (n/2+1)-th to n-th word lines.

17. The operating method of claim 13, wherein the first path and the second path are configured to supply a positive supply voltage, and
wherein the operating method further comprises applying a ground potential to one bit line of each of a plurality of pairs of bit lines arranged in the cell array, based on the write data.

18. The operating method of claim 13, wherein each of the plurality of memory cells comprises a static random access memory (SRAM) cell comprising a pair of cross-coupled inverters.

19. The operating method of claim 13, further comprising:
receiving a read command; and
supplying power to the cell array through the first path and the second path based on the read command.

* * * * *